(12) United States Patent
Fortin et al.

(10) Patent No.: US 7,969,195 B1
(45) Date of Patent: *Jun. 28, 2011

(54) ACTIVE BIASING IN METAL OXIDE SEMICONDUCTOR (MOS) DIFFERENTIAL PAIRS

(75) Inventors: Guillaume Fortin, Verdun (CA); Charles Roy, St-Jerome (CA); Mathieu Gagnon, Verdun (CA)

(73) Assignee: PMC-Sierra, Inc., Santa Clara, CA (US)

( * ) Notice: Subject to any disclaimer, the term of this patent is extended or adjusted under 35 U.S.C. 154(b) by 276 days.

This patent is subject to a terminal disclaimer.

(21) Appl. No.: 12/265,609

(22) Filed: Nov. 5, 2008

Related U.S. Application Data

(63) Continuation of application No. 11/128,953, filed on May 12, 2005, now Pat. No. 7,471,107.

(60) Provisional application No. 60/570,167, filed on May 12, 2004.

(51) Int. Cl.
 *H03K 19/094* (2006.01)
(52) U.S. Cl. .......................................... 326/83; 326/87
(58) Field of Classification Search ............... 326/82–87
 See application file for complete search history.

(56) References Cited

U.S. PATENT DOCUMENTS

| | | | |
|---|---|---|---|
| 5,510,729 A | 4/1996 | Reymond | |
| 5,959,492 A * | 9/1999 | Khoury et al. ............... | 327/389 |
| 6,114,898 A | 9/2000 | Okayasu | |
| 6,288,604 B1 | 9/2001 | Shih et al. | |
| 6,507,218 B1 | 1/2003 | To et al. | |
| 6,577,154 B2 | 6/2003 | Fifield et al. | |

OTHER PUBLICATIONS

USPTO; Office Action dated Mar. 13, 2007, from related application U.S. Appl. No. 11/128,953, filed May 12, 2003.
USPTO; Office Action dated Aug. 23, 2007, from related application U.S. Appl. No. 11/128,953, filed May 12, 2003.
USPTO; Office Action dated Jan. 29, 2008, from related application U.S. Appl. No. 11/128,953, filed May 12, 2003.
USPTO; Office Action dated Aug. 8, 2008, from related application U.S. Appl. No. 11/128,953, filed May 12, 2003.

* cited by examiner

*Primary Examiner* — Rexford N Barnie
*Assistant Examiner* — Thienvu V Tran
(74) *Attorney, Agent, or Firm* — Knobbe Martens Olson & Bear LLP

(57) ABSTRACT

Apparatus and methods advantageously maintain transistors of open-drain differential pairs biased in the saturation region when "active," rather in than the triode or linear region. The biasing techniques are effective over a broad range of process, voltage, and temperature (PVT) variations. By controlling a high voltage level used to drive the gate of a transistor of the differential pair, the biasing of the transistor in the saturation region is maintained. In one embodiment, the low voltage level used to cut off the transistor of the differential pair is also controlled. These techniques advantageously permit differential drivers to exhibit relatively large output swings, relatively high edge rates, relatively high return loss, and relatively good efficiency.

11 Claims, 15 Drawing Sheets

Fig. 4 *PRIOR ART*

ACTIVE BIASING IN METAL OXIDE SEMICONDUCTOR (MOS) DIFFERENTIAL PAIRS

CROSS-REFERENCE TO RELATED APPLICATIONS

This application is a continuation application of U.S. application Ser. No. 11/128,953, filed May 12, 2005, now U.S. Pat. No. 7,471,107, issued Dec. 30, 2008, which claims the benefit under 35 U.S.C. §119(e) of U.S. Provisional Application No. 60/570,167, filed May 12, 2004, the disclosures of each of which are hereby incorporated by reference herein.

BACKGROUND

1. Field of the Invention

The invention generally relates to differential circuits using metal-oxide semiconductor (MOS) field effect transistors (FETs). In particular, embodiments are applicable to the biasing of any MOS transistor differential pair configuration for which the gate voltage can be adjusted and biasing in the saturation region is desirable.

2. Description of the Related Art

Differential signaling is often used in high-speed data transmission systems in a variety of applications including in printed-circuit boards, cables and backplanes. When compared to single-ended signaling, it provides a higher signal integrity because of its superior common-mode noise immunity and of the threshold level that is unaffected by differences in ground or supply levels.

High-speed transmission of electrical signals requires that the output impedance of the driver and the input impedance of the receiver be relatively well matched to that of the transmission medium. When this is not the case, the impedance mismatches will typically create reflections that will affect the integrity of the received signal. In typical systems, the impedance of the medium varies between 50Ω and 75Ω, with the driver and the receiver being terminated having 50Ω to 75Ω single-ended terminations or 100Ω to 150Ω differential terminations. FIG. 1 illustrates an example of a link with a driver and a receiver and terminations at both ends.

In many circuits using complementary MOS (CMOS) technology, differential output drivers are commonly implemented as a differential open-drain driver with resistive loads. FIG. 2 illustrates an example such a driver using a differential pair of N-channel or N-type of MOS transistors in the driver. Of course, P-channel or P-type devices can also be used. In such a driver, the resistive loads R1, R2 are generally set to approximately 50Ω or 75Ω to ensure a proper near-end termination. With this approach, it is desirable to maintain relatively high output impedance in the transistors of the differential pair so that the output impedance is mainly determined by the resistive loads R1, R2. Providing a termination that matches well with the transmission line ensures a high return loss for the driver at low frequencies.

To maintain a relatively good return loss for an open-drain differential driver at high frequencies, the drain capacitance of the differential pair transistors is preferably kept relatively low. One way to achieve relatively low capacitance is to bias the transistors in the saturation region when "on," rather than in the triode or linear region. It will be understood that when a differential pair is used for data transmission, one of the transistors will typically be biased "on" and the other transistor will typically be biased "off" (except during transitions). In other applications, both transistors of the differential pair can be "on." FIG. 3 illustrates a family of curves for an N-channel device and graphically indicates the triode or linear region and the saturation region. FIG. 3 also illustrates a sub-threshold region. These regions will also be described in greater detail with equations. In the saturation region, the transistor's channel is pinched off near the drain, which advantageously reduces the drain-gate capacitance. This reduction in capacitance also has the added benefit of improving the edge rates at the driver output, which permits relatively higher transmission rates.

In addition to obtaining relatively high return loss, it can be useful to maintain a well-controlled output swing. In data communication applications, the transistors of a differential pair typically switch between active (on) and inactive states (off). When the transistors are biased to the saturation region when "on" rather than to the linear region, the transistors are more readily transitioned to an inactive state, which reduces the leakage current of the inactive branch of a differential pair for a given input voltage swing. With relatively small leakage current, the current $I_{OUT}$ and the value of the load resistors R1, R2 define the output swing. This can be a significant benefit when the pre-driver (driver of the differential driver) has a relatively limited output swing with a low level that is not guaranteed to fully turn off the transistor of the inactive branch in the output driver. For example, this can occur when the pre-driver is implemented with a differential circuit similar to that of the output driver.

FIG. 4 illustrates a conventional differential open-drain driver with generic blocks for the loads L1, L2. The skilled artisan will appreciate that a wide variety of loads L1, L2 can be used, including, but not limited to, transistor loads or external resistive loads, without a loss in generality. While N-type MOS transistors (NMOS) are illustrated, the skilled artisan will also appreciate that the driver can also be made with P-type of MOS transistors (PMOS).

In the differential output driver illustrated in FIG. 4, the output voltage ($V_{OP}-V_{ON}$) is created by switching the current $I_{OUT}$ to the loads L1 and L2 through the differential pair transistors M1 and M2. This switching is enacted by applying a differential input voltage ($V_{IP}-V_{IN}$) to the differential pair transistors. Depending on the values of $V_{DD}$, $V_{SS}$, $I_{OUT}$, $V_{IP}$, $V_{IN}$, $V_{OP}$ and $V_{ON}$, the differential pair transistors can operate either in the triode region or the saturation region when active. As described earlier, in differential open-drain drivers, there are significant benefits to maintaining driver transistors M1, M2 in their saturation region ($V_{DS}>V_{DSAT}$) when active.

When driver transistors M1, M2 are biased in the saturation region when active, their output impedance is relatively high, and their output current is relatively independent of their drain-source voltage ($V_{DS}$). This reduces the sensitivity of the output swing to supply variations. When the loads L1, L2 are used as termination resistors, the relatively high output impedance of the driver transistors M1, M2 ensures that the output impedance of the driver is mainly determined by the loads L1, L2. This allows for relatively accurate termination impedance across process variations and improves the low frequency return loss at the driver output. Maintaining a relatively high output impedance for driver transistors M1, M2 also reduces the output capacitance of the current source $I_1$ seen at the output nodes, which has a relatively large benefit on return loss and edge rates.

In the saturation region, the drain-gate capacitance ($C_{GD}$) of driver transistors M1, M2 is relatively small due to the narrow channel at the drain. The reduction of $C_{GD}$ increases the bandwidth, reduces the rise times and improves high frequency return loss at the driver output ($V_{OP}$, $V_{ON}$). It allows for a reduction in the size and power consumption of the pre-driver circuit and minimizes feedthrough from the driver input to the driver output.

Equation 1 illustrates conditions for a transistor in the differential pair to be in the saturation region. It will be understood that while illustrated in the context of NMOS, the principles also apply to PMOS.

$$V_{DS} \geq V_{GS} - V_T \qquad \text{Equation 1}$$

In Equation 1, $V_T$ is the threshold voltage of the differential pair transistors (M1, M2). In the literature, the threshold voltage is also written $V_{TH}$.

From Equation 1, it can be observed that the output differential pair can be kept in saturation either by reducing the output swing to increase $V_{DS}$ or by making the devices relatively larger to reduce $V_{GS} - V_T$ for a given output swing. Neither option is desirable in a high-speed differential open drain driver for which a common design goal is to make an efficient use of dissipated power by achieving a relatively high output swing with relatively low input and output capacitance to ensure relatively fast edge rates.

Also, maintaining the transistors of the differential pair in the saturation region when active can reduce the pre-driver swing used for ensuring that there is no significant leakage in the inactive branch. A transistor should be "off" when the gate-to-source voltage $V_{GS}$ of the transistor is less than the threshold voltage $V_T$ of the transistor. In practice, it will be understood that a gate-to-source voltage $V_{GS}$ that is lower than the threshold voltage $V_T$ by a small amount $\Delta V$ is typically used to compensate for second-order effects that can result in sub-threshold currents. These sub-threshold currents are typically reduced exponentially in proportion to the small amount $\Delta V$ so that $\Delta V$ is typically relatively small. The reduction in swing can be a significant benefit when the pre-driver has a relatively limited output swing with a low level that is not guaranteed to fully turn off the transistor of the inactive branch in the output driver for all pre-driver common-mode levels.

One conventional approach to the design of open-drain differential drivers is to select the minimum-size differential pair that allows the $I_{OUT}$ current to be switched completely through the active transistor of the differential pair, while leaving enough headroom for the precise operation of the current source $I_1$. To keep the differential pair transistors in saturation when a large output swing is used, it is often necessary to lower the high output voltage of the pre-driver circuit (denoted $V_{GHIGH}$). FIG. 5 illustrates high and low pre-driver output voltages that are applied as inputs to gates of the differential pair (N-channels illustrated). This level shifting of the input voltage of the differential pair transistors effectively lowers their source voltage ($V_S$) and increases their drain-to-source voltage $V_{DS}$ for a relatively constant gate-to-source voltage $V_{GS}$.

However, the use of deep-sub-micron technologies using low supply voltages, for example, on the order of 1V and less, renders this traditional approach impractical. Accordingly, the objectives of relatively large output swings while keeping the output transistors in saturation, as required to achieve fast output transitions and good return loss, are difficult to achieve.

For large output swings in these technologies, or very large swings in higher voltage technologies, it is difficult to determine a static pre-driver high output voltage level that will guarantee the saturation of the differential pair transistors across process, voltage and temperature variations (PVT).

This can be readily illustrated with a simple example. Consider the basic equation for the drain current ($I_D$) of the MOS transistor operating in the saturation region (N-channel):

$$I_D = K^*(V_{GS} - V_T)^2 \qquad \text{Equation 2}$$

From Equation 2, it can be seen that process variations in the threshold voltage $V_T$ require a similar variation of the gate-source voltage $V_{GS}$ to maintain a constant drain current $I_D$. It should also be noted that for the differential pair of the open-drain driver, the minimum source voltage is fixed by the headroom required for the precise operation of the current source $I_1$ and that the minimum drain voltage is set by $V_{DD}$ minus the output swing.

From these observations and Equation 1, it is apparent that the designer of a relatively high swing open-drain differential driver faces two conflicting constraints with respect to gate voltage. For process variations characterized by relatively high threshold voltage $V_T$, the gate voltage of the active transistor in the differential pair should be increased to maintain a $V_{GS} - V_T$ large enough to fully commutate $I_{OUT}$ while maintaining sufficient headroom for the current source $I_1$. For process variations characterized by relatively low threshold voltage $V_T$, the source voltage of the active transistor is naturally higher and pushes the transistor out of saturation since its drain voltage is fixed by $V_{DD}$ and the output swing. In this low threshold voltage $V_T$ process corner, the gate voltage of the active transistor should thus be lowered to similarly lower the active transistor's source voltage and increase its $V_{DS}$ so that the transistor can operate in the saturation region while active.

Note that this example is illustrative of only one of the many possible impacts of process, voltage and temperature (PVT) variations. It will be understood that other process variations will introduce other compromises and that these variations can also be combined.

SUMMARY

Embodiments advantageously maintain transistors of open-drain differential pairs biased in the saturation region when "active," rather in than the triode or linear region. The biasing techniques described herein are advantageously effective over a broad range of process, voltage, and temperature (PVT) variations. By controlling a high voltage level used to drive the gate of a transistor of the differential pair, the biasing of the transistor in the saturation region is maintained.

One embodiment is a biasing circuit for a differential driver, where the biasing circuit includes: a pre-driver circuit configured to generate a differential output signal, where each portion of the differential output signal is intended to be operatively coupled to gates of first and second source-coupled transistors of the differential driver, where each portion of the differential output signal has a single-ended voltage swing from a first voltage level to a second voltage level for inactivating and for activating, respectively, the transistors of the differential driver, where the pre-driver circuit is configured to receive an adjustment signal as a reference input for the second voltage level; and a feedback circuit operatively coupled to a sense signal as a first input and to a voltage reference as a second input, where the feedback circuit is configured to manipulate the adjustment signal such that the first input and the second input at least approximately match and such that the second voltage level biases the activated transistor of the differential driver to the saturation region and not to the triode or linear region.

One embodiment is a biasing circuit for a differential driver, where the biasing circuit includes: a pre-driver circuit configured to generate a differential output signal, where each portion of the differential output signal is intended to be operatively coupled to gates of first and second source-coupled transistors of the differential driver, where each portion of the differential output signal has a single-ended voltage swing from a first voltage level to a second voltage level for deactivating and for activating, respectively, the transistors of the differential driver, where the pre-driver circuit is configured to receive an adjustment signal as a reference input for the second voltage level; and a replica transistor circuit having a replica transistor configured to be biased in the saturation region, where a gate voltage of the replica transistor circuit is operatively coupled to the pre-driver circuit as the adjustment signal, such that the high voltage level biases the activated transistor of the differential driver to the saturation region and not to the triode or linear region.

One embodiment is a biasing circuit for a differential driver with a first transistor and a second transistor, where the biasing circuit includes: a pre-driver circuit adapted to provide a differential drive signal to a gate of the first transistor and to a gate of the second transistor, where each portion of the differential drive signal is switched between a first voltage level and a second voltage level higher than the first voltage level in a complementary manner such that the transistor receiving the first voltage level is deactivated and the transistor receiving the second voltage level is activated; and electronic means for adjusting at least the second voltage level such that the activated transistor is operating in the saturation region.

One embodiment is a method of biasing a differential driver with a first transistor and a second transistor, where the method includes: providing a differential drive signal to a gate of the first transistor and to a gate of the second transistor, where each portion of the differential drive signal is switched between a first voltage level and a second voltage level higher than the first voltage level in a complementary manner such that the transistor receiving the first voltage level is deactivated and the transistor receiving the second voltage level is activated; and electronically adjusting at least the second voltage level such that the activated transistor is operating in the saturation region.

BRIEF DESCRIPTION OF THE DRAWINGS

These drawings and the associated description herein are provided to illustrate embodiments and are not intended to be limiting.

DETAILED DESCRIPTION OF EMBODIMENTS

Although particular embodiments are described herein, other embodiments, including embodiments that do not provide all of the benefits and features set forth herein, will be apparent to those of ordinary skill in the art.

While generally illustrated in the context of differential circuits using N-type MOSFET (NMOS) transistors in the differential pairs, the skilled practitioner will appreciate that the principles and advantages described herein will also be applicable to differential circuits using P-type (PMOS) transistors in the differential pairs. In addition, the principles and advantages described herein can also be applied to differential drivers that use a combination of an NMOS and a PMOS differential pairs. Such structures are relatively common in low voltage differential signaling (LVDS) drivers. Examples of differential signaling protocols include XAUI, CEI-6, SAS, SATA, FiberChannel, and the like. For example, biasing circuits and corresponding drivers can be embodied in the same integrated circuit, such as in a chip for a serializer/deserializer (SerDes). The teachings can also be applied to single-ended or differential open-drain drivers using a cascoded output structure to control the saturation of the differential pair transistors as well as the saturation of the cascode transistors. In addition, it should be noted that embodiments can be applied to the biasing of differential analog circuits as well as differential digital circuits.

Figure 2:
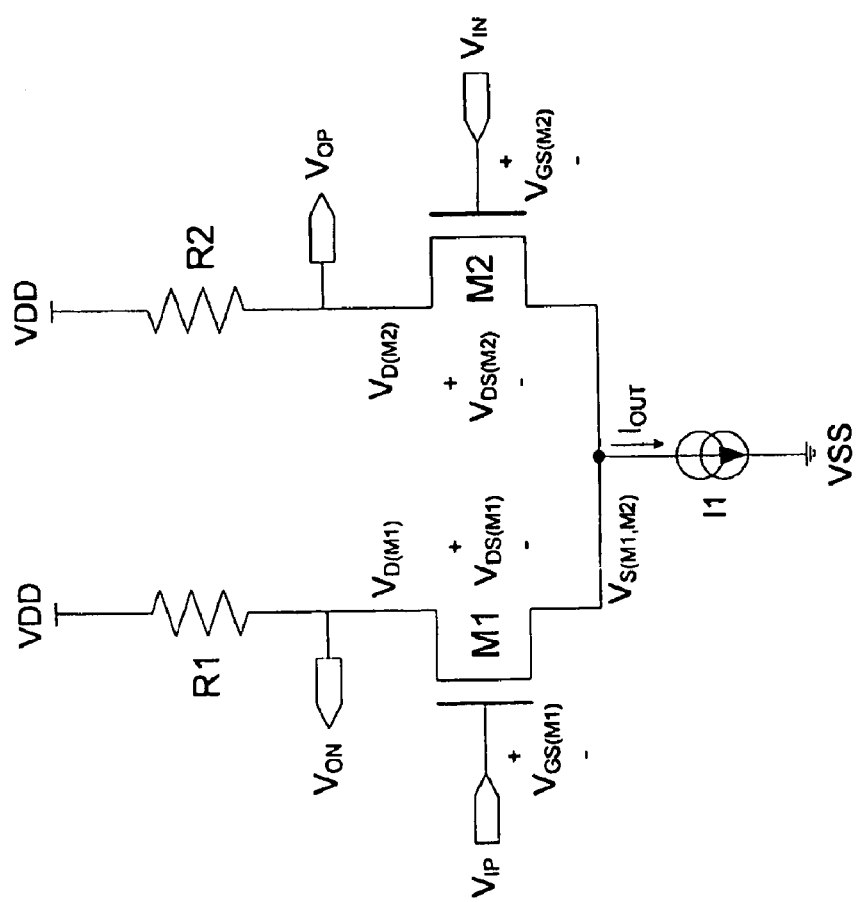
FIG. 2 illustrates an example of a differential open-drain driver with resistive loads.
Figure 3:
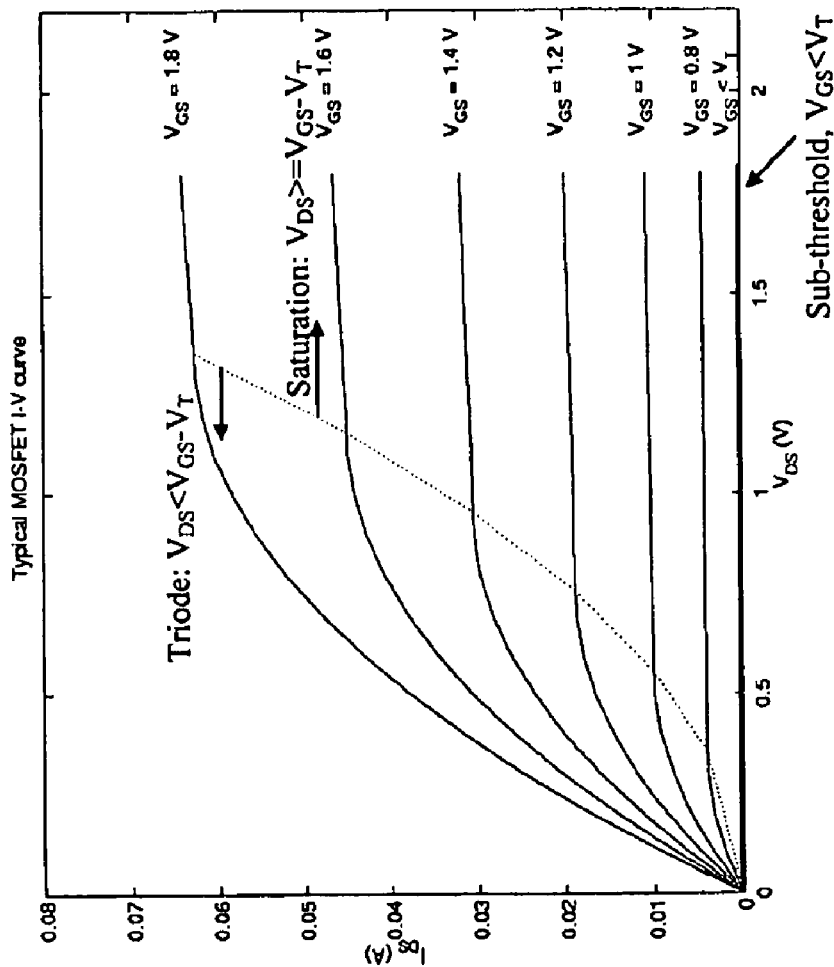
FIG. 3 illustrates a family of curves for an N-channel device and graphically illustrates the triode or linear region and the saturation region.
Figure 4:
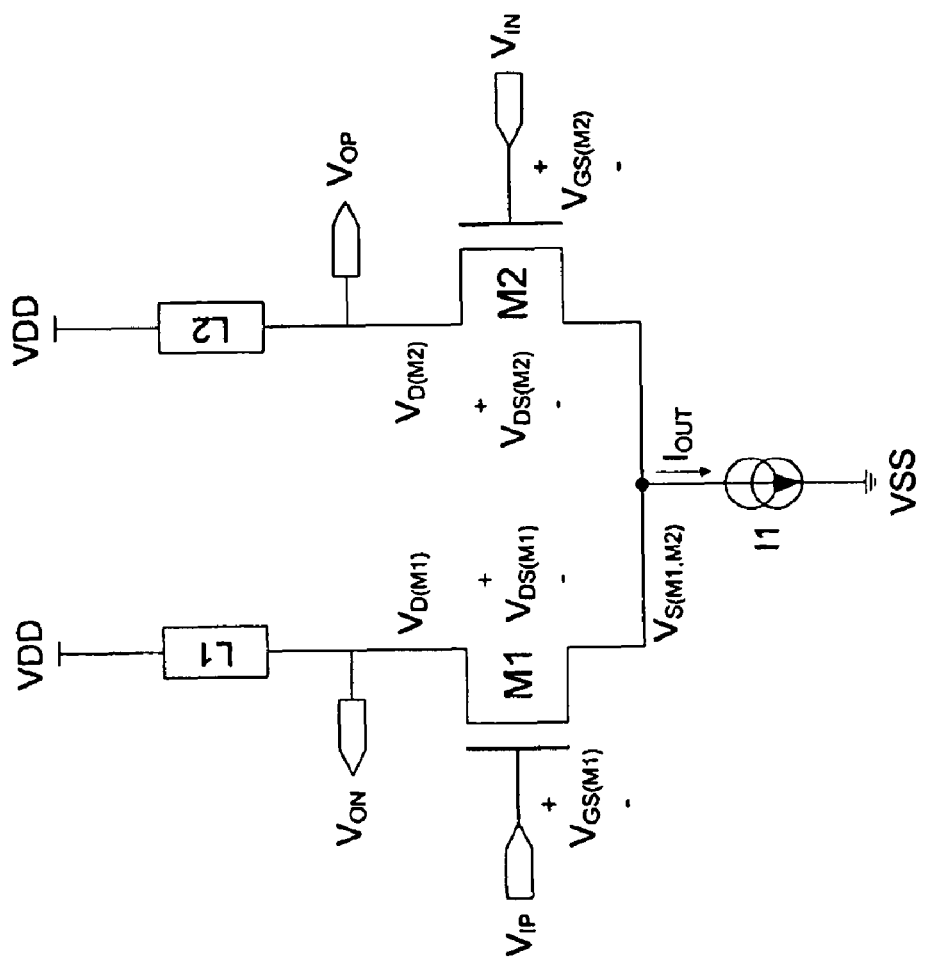
FIG. 4 illustrates an example of a differential open-drain driver with generic or unspecified loads.

Advantageously, embodiments control biasing for the transistors of driver transistors, such as transistors M1, M2 of FIG. 2, such that when "on," the transistors are operating in the saturation region and not the triode or linear region. Advantageously, embodiments maintain the operation in the saturation region across process, voltage, and temperature (PVT) variations. In addition, area, power consumption and supply-noise induction problems can also be reduced, as transistor sizes can be made smaller for the same performance through process corners (extremes of PVT variations).

Figure 5:
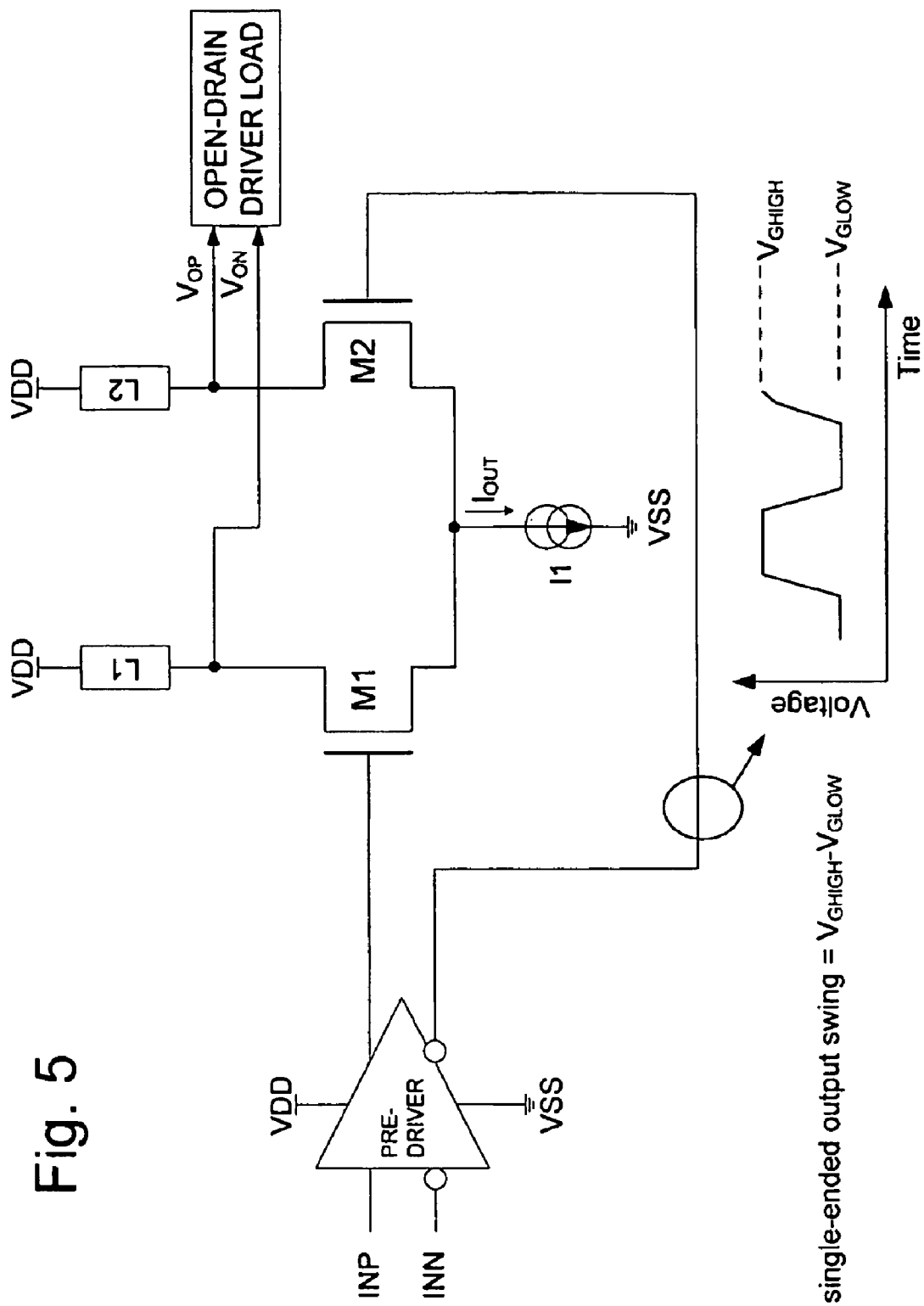
FIG. 5 illustrates high and low driver voltages ($V_{GHIGH}$ and $V_{GLOW}$) for N-channel devices.

Optionally, selected embodiments can optionally also control the pre-driver low voltage level amplitude $V_{GLOW}$ used. The low voltage level amplitude $V_{GLOW}$ is illustrated in FIG. 5. This reduces power consumption and feed-through of the pre-driver circuit to the output. It also helps reduce the amplitude typically used to drive the pre-driver circuit itself, easing the driving of the pre-driver circuit.

It should be noted that some of the embodiments described herein make use of matching techniques available in integrated circuits to match the transfer characteristics of multiple devices. It will also be understood by the skilled practitioner that scaled versions of matched devices can also be generated by placing several instances of the devices in parallel, yielding matched devices with relatively equally scaled characteristics. Within this disclosure, matched devices (scaled or unscaled) are referred to as "replica" devices. In addition, embodiments provide benefits even when devices are not matched. For example, devices that are not matched but formed at the same time will typically be subjected to the same process variations.

Embodiments illustrate adaptive biasing techniques that maintain the differential pair transistors of open-drain output drivers in the saturation region (when "on") across a broad variety of process, voltage, and temperature (PVT) variations. This advantageously reduces output capacitance and enhances edge rates for higher data rates. One embodiment provides this enhancement by controlling the high level from the pre-driver circuit ($V_{GHIGH}$) that is applied to the gates of the differential pair. The high voltage level amplitude $V_{GHIGH}$ is illustrated in FIG. 5. This adjustment to the high level can also be combined with a control of the low level from the pre-driver circuit ($V_{GLOW}$). The low voltage level amplitude $V_{GLOW}$ is illustrated in FIG. 5.

In conventional approaches, differential open-drain drivers have been used with pre-driver circuits with a relatively constant high output level ($V_{GHIGH}$). When relatively large output swings are used, this has the undesirable effect of pushing the differential pair transistors of the open-drain driver out of the saturation region when "on."

Equation 3 expresses the condition for the saturation voltage of an N-channel MOSFET transistor. To be in the saturation region, a transistor's drain-to-source voltage $V_{DS}$ should be greater than the saturation voltage $V_{DSAT}$ expressed in Equation 3.

$$V_{DSAT} = V_{GS} - V_T \qquad \text{Equation 3}$$

It should be noted that the gate-to-source voltage $V_{GS}$ used to fully commutate the output current in the differential pair varies with process and temperatures. A larger $V_{GS}$ is used for "slow" (high $V_T$, low $I_{DSAT}$, etc.) process variations, than is used for "fast" (low $V_T$, high $I_{DSAT}$, etc.) process variations. Extreme combinations of slow process variations and fast process variations are also termed "slow corners" and "fast corners." Temperature variations also have an effect that should be compensated.

In a differential open-drain driver as illustrated in FIG. 2, the drain and source voltages of the differential pair transistors have relatively well-defined limits for which the circuit operates relatively well or even optimally. The maximum value of the voltage appearing at the drain is typically the supply voltage $V_{DD}$ minus the output swing, which is nominally $I_{OUT}$ multiplied by the impedance of the total output load, including loads represented by resistors R1 and R2. The minimum value of the voltage appearing at the source is typically equal to the voltage used to ensure accurate operation of the current source that regulates $I_{OUT}$.

The voltage at the sources of the differential pair transistors is determined by the applied gate voltages ($V_G$) and the gate-to-source voltages ($V_{GS}$) of the transistors. When a relatively constant gate voltage $V_G$ is selected for use with all process corners or process extremes, the devices corresponding to "slow" corners and their relatively high gate-to-source voltage $V_{GS}$ will have a relatively lower source voltage $V_S$ and hence a relatively higher drain-to-source voltage $V_{DS}$ than the devices corresponding to "fast" corners and their low $V_{GS}$. For a large enough output swing and relatively constant gate voltage $V_G$, it becomes difficult to keep a source voltage $V_S$ sufficient for saturation of the current source in the "slow" corners and yet a high enough drain-to-source voltage $V_{DS}$ for saturation of the differential pair in the "fast" corners.

The lack of saturation is even more problematic in deep sub-micron technologies, which use relatively low supply voltages, and further degrades the circuit performance. For example, degradation is exhibited by reduced edge rates, reduced high-frequency return loss and increased pre-driver circuit loading due to the increase in the drain-gate capacitance of the differential pair transistors. In another example, degradation is exhibited by reduced low frequency return loss due to the reduced output impedance of the differential pair transistors. This also results in reduced return loss at intermediate and at high frequencies as the output capacitance of the current source is seen through the relatively low impedance of the differential pair transistors while operating in the triode or linear region.

One embodiment advantageously uses an active biasing mechanism to compensate for process, voltage, and temperature (PVT) variations and provide relatively good operation of the differential open-drain driver across corners. When the drain voltage of the differential pair transistors is constrained by the supply voltage $V_{DD}$ and by the output swing, the only way to increase the drain-to-source voltage $V_{DS}$ (when "on") of a transistor of the differential pair transistors is to lower the source voltage. This can be achieved by lowering their gate voltage ($V_G$), as their gate-source voltage ($V_{GS}$) is relatively constant for a given current in the saturation region.

Control of Transistors' Saturation in Differential Open-Drain Drivers

Figure 6:
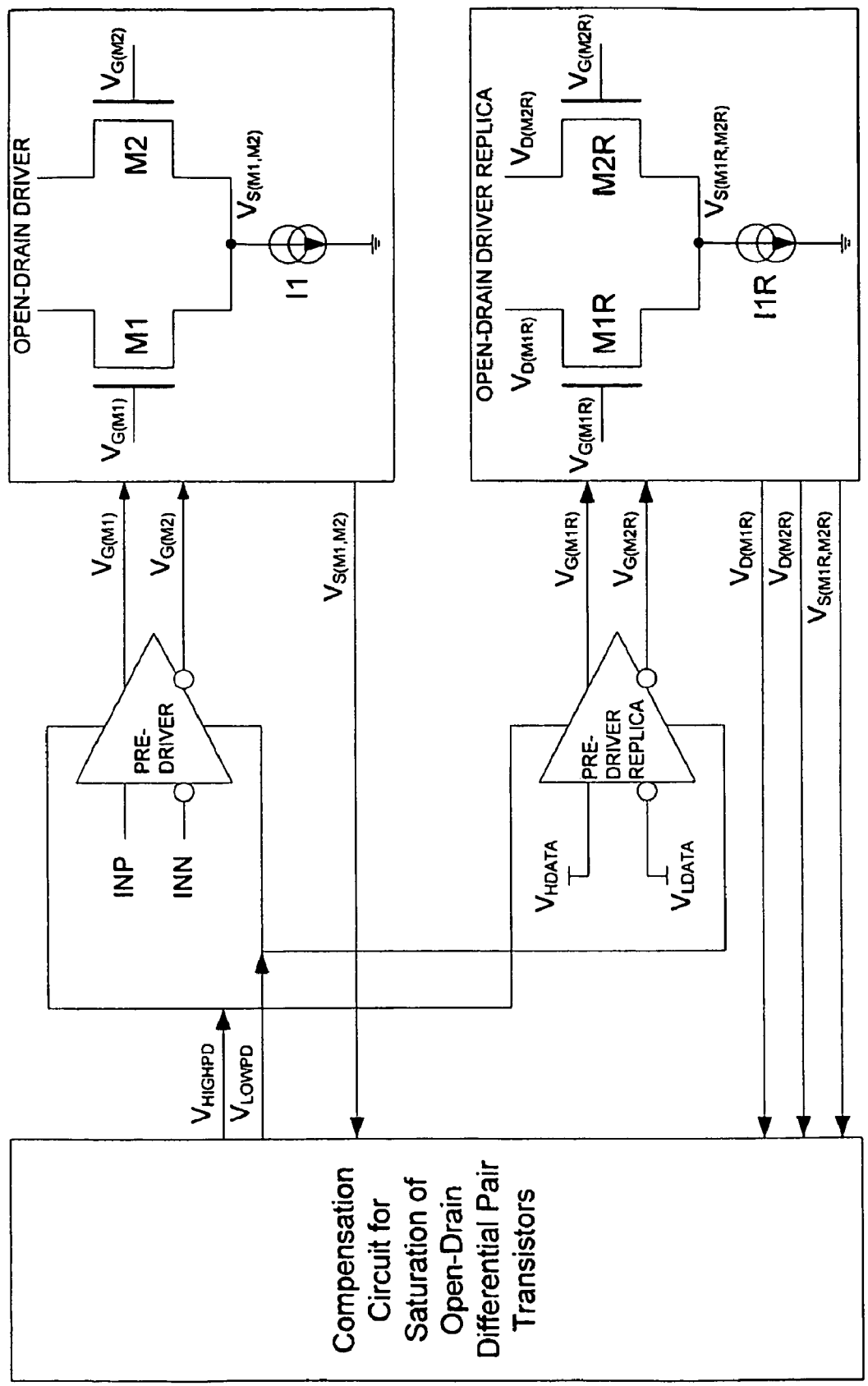
FIG. 6 illustrates a general overview of multiple possible embodiments of saturation control of the differential pair transistors of an open-drain driver.

FIG. 6 illustrates a general overview of multiple possible embodiments of saturation control of the differential pair transistors of an open-drain driver. The saturation control techniques provide gate drive voltages to bias the differential pair transistors to operate in and out of the saturation region, advantageously enhancing performance of the corresponding open-drain driver. A broad variety of circuits will be described later in greater detail. These circuits include, but are not limited to: (a) generation of the high voltage level ($V_{GHIGH}$) from regulation of the source voltage $V_{S(M1,M2)}$ of the differential pair transistors of the open drain driver as will be described in greater detail later in connection with FIG. 7; (b) generation of the high voltage level ($V_{GHIGH}$) from regulation of the source voltage $V_S$ of a replica of the open drain driver (not illustrated); (c) generation of the high voltage level ($V_{GHIGH}$) from regulation of the drain voltage $V_{D(M1,M2)}$ through the generation of a threshold voltage $V_T$ from a replica circuit as will be described in greater detail later in connection with FIG. 9; (d) generation of the high voltage level ($V_{GHIGH}$) from regulation of a drain-to-source voltage $V_{DS}$ of a replica circuit as will be described in greater detail later in connection with FIG. 10; and (e) generation of the high voltage level ($V_{GHIGH}$) from a gate voltage $V_G$ of a replica transistor, which is a replica of a transistor of the differential pair of the open-drain driver as will be described in greater detail later in connection with FIG. 11A.

It should be noted that the embodiments described in connection with FIGS. 7, 9, and 10 use an operational amplifier and a feedback loop to generate the high voltage level $V_{GHIGH}$ for driving the differential pair of the open-drain driver. While illustrated with the adjustment of the high voltage level $V_{GHIGH}$, it will be understood by one of ordinary skill in the art that the feedback loop can also be used to adjust the low output level of the pre-driver circuit $V_{GLOW}$, both the high and the low output levels of the pre-driver circuit $V_{GHIGH}$ and $V_{GLOW}$, respectively, or even a common-mode level from which the high and/or the low output levels are derived.

The embodiments described in connection with FIGS. 11 and 13 do not use an operational amplifier and a feedback loop to generate the high voltage level $V_{GHIGH}$. Further, the embodiment that will be described later in connection with FIG. 13 also generates a low voltage level $V_{GLOW}$ for driving the differential pair of the open-drain driver. As will be explained later, in the embodiments of FIGS. 11 and 13, a local feedback exists in the biasing of the replica transistor itself through its drain to gate connection. A follower circuit is then used so that the high output level of the pre-driver circuit tracks the gate voltage $V_G$ or the replica transistor.

The methods above can also be combined with replica structures to generate reference current and voltages that track Process, Voltage and Temperature variations. For example, FIG. 8 illustrates a circuit that generates a relatively small drain voltage, such as minimal, for an output current sink or source (embodied by an open-drain circuit such as transistor M3 726) to keep the current source operating in the saturation region. For example, this circuit can be applied to the embodiments described in connection with FIGS. 7, and 10.

Figure 11A:
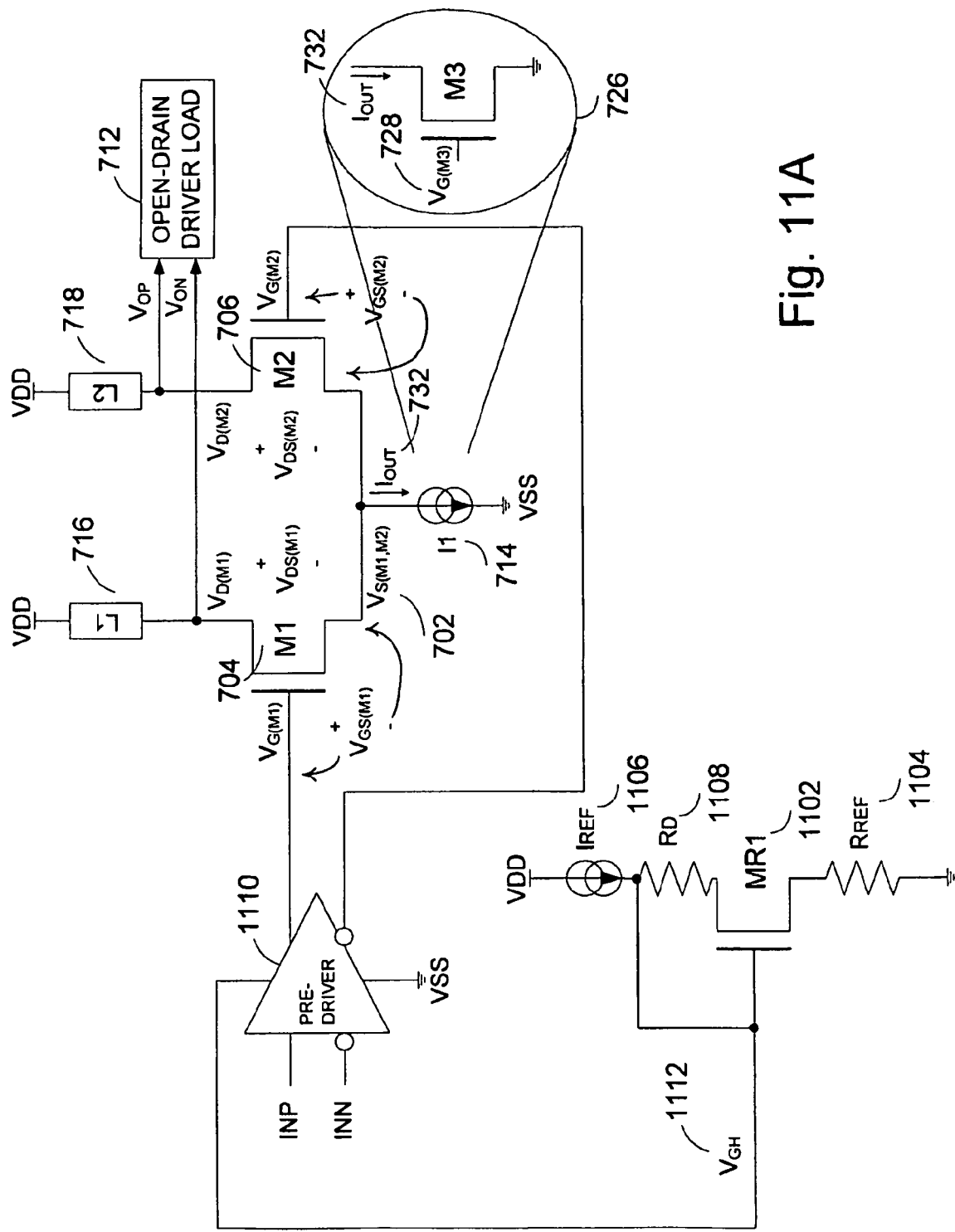
FIG. 11A illustrates an example of a biasing circuit using a replica of a differential pair transistor in an open-loop manner to bias the "high" voltage $V_{GHIGH}$ that drives the differential pair.
Figure 11B:
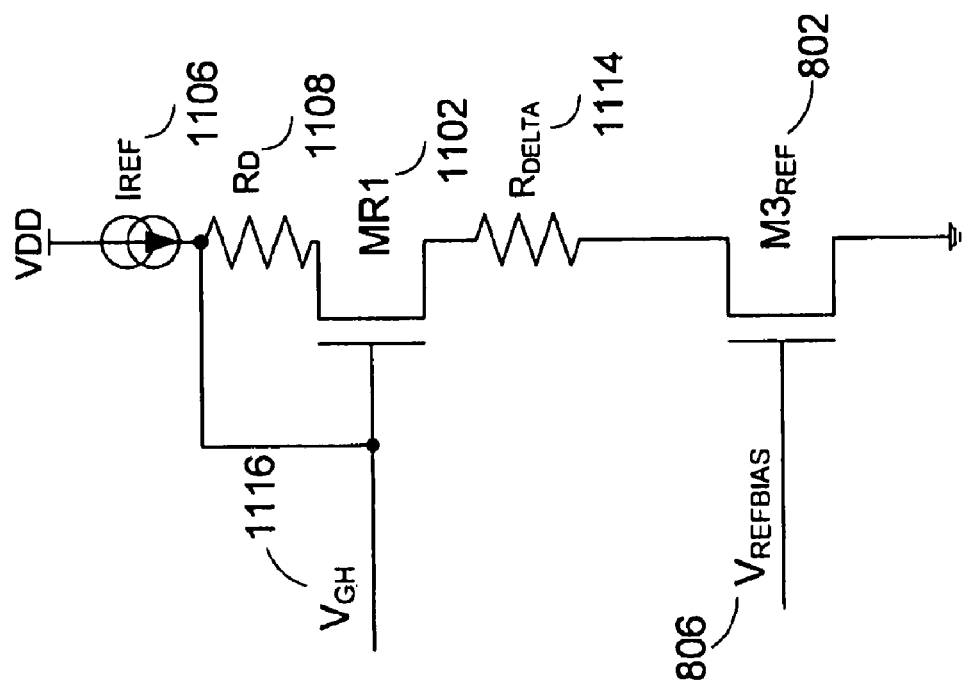
FIG. 11B illustrates an example of generation of a voltage reference $V_{GH}$.
Figure 12:
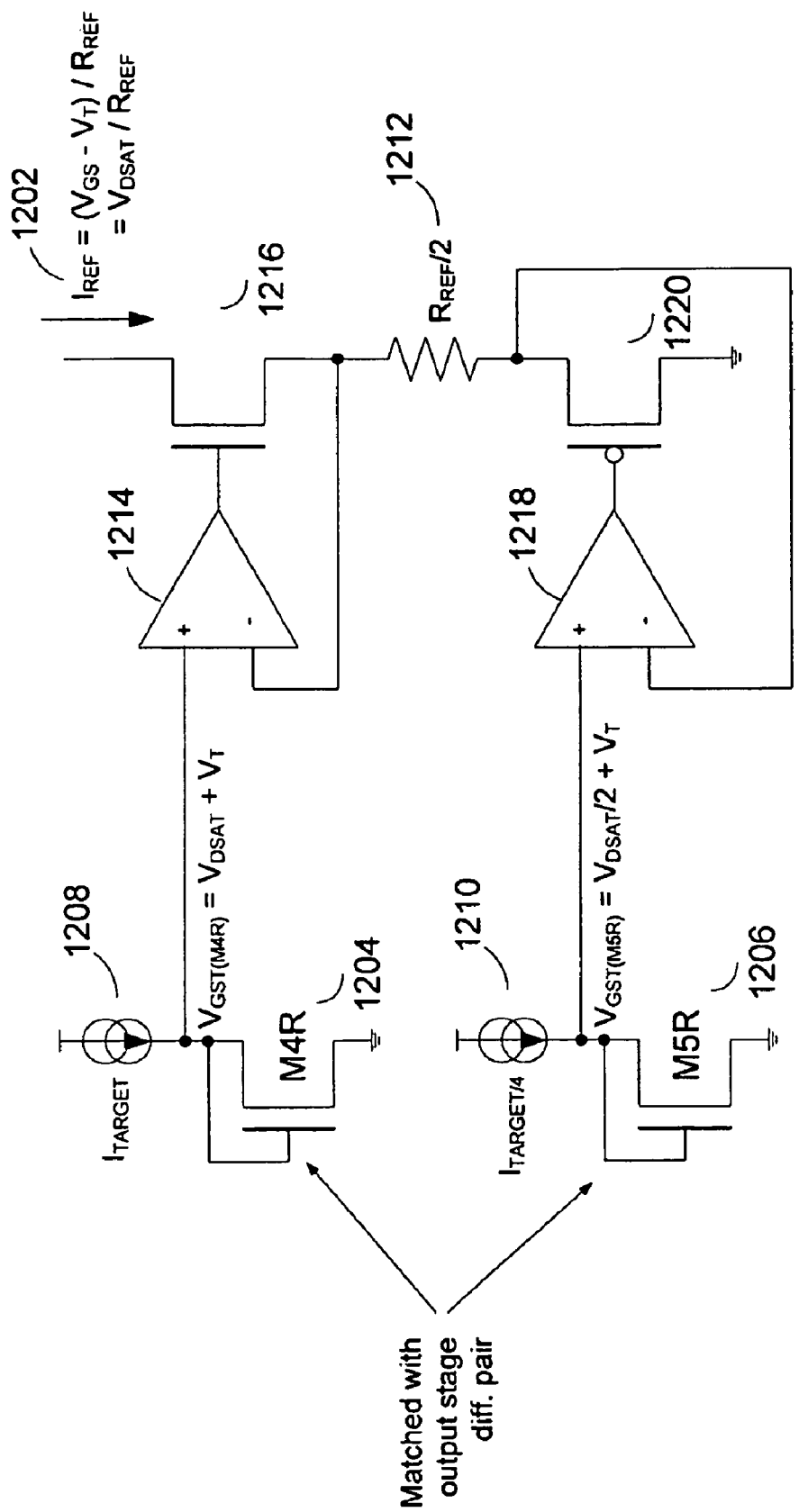
FIG. 12 illustrates an example of a circuit that generates a current that is proportional to the saturation voltage $V_{DSAT}$ of a target transistor.

FIG. 12 illustrates a circuit that generates a relatively small current $I_{REF}$, such that the voltage resulting from the product of $I_{REF}$ and $R_{REF}$ generates a relatively low voltage, such as the minimal voltage, to keep a transistor saturated when the resulting voltage is applied to the drain-source nodes of a transistor used in the same conditions as transistor M4R 1204 and transistor M5R 1206. For example, this circuit can be used to set the value of the reference currents $I_{REF}$ 730, $I_{REF}$ 1030 and $I_{REF}$ 1032 described in connection with FIGS. 7 and 10. The method described in FIG. 12 can also be used to supply current for resistors $R_{REF}$ 1104 and $R_{REF}$ 1312 of FIG. 11 or 13, respectively, provided reference currents $I_{REF}$ 1106 and $I_{REF}$ 1310 are sunk from node 1314.

Figure 13:
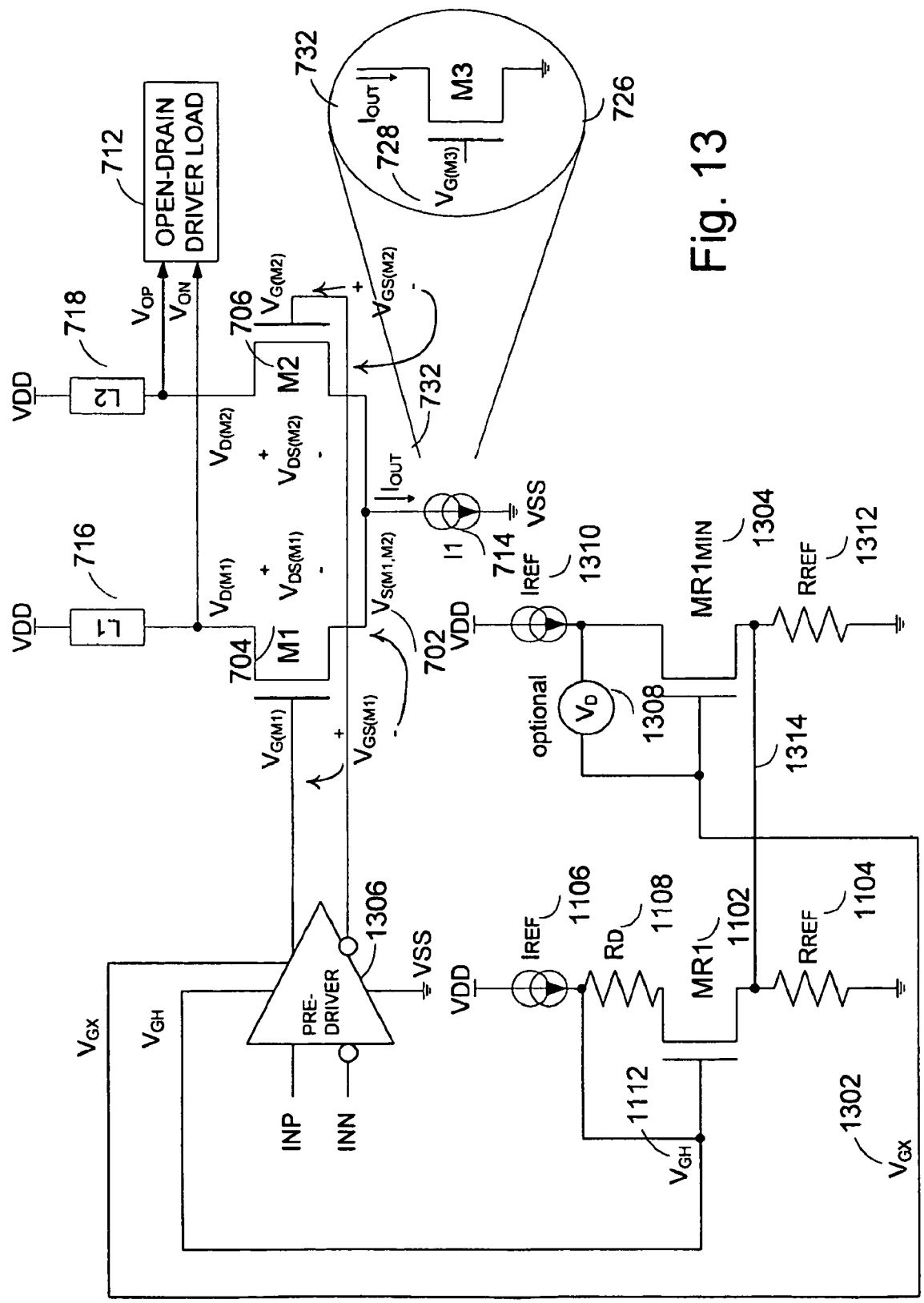
FIG. 13 illustrates an example of a biasing circuit using replicas of a differential pair transistor in an open-loop manner to bias the "high" voltage level $V_{GHIGH}$ and the "low" voltage level $V_{GLOW}$ that drives the differential pair.
Figure 14:
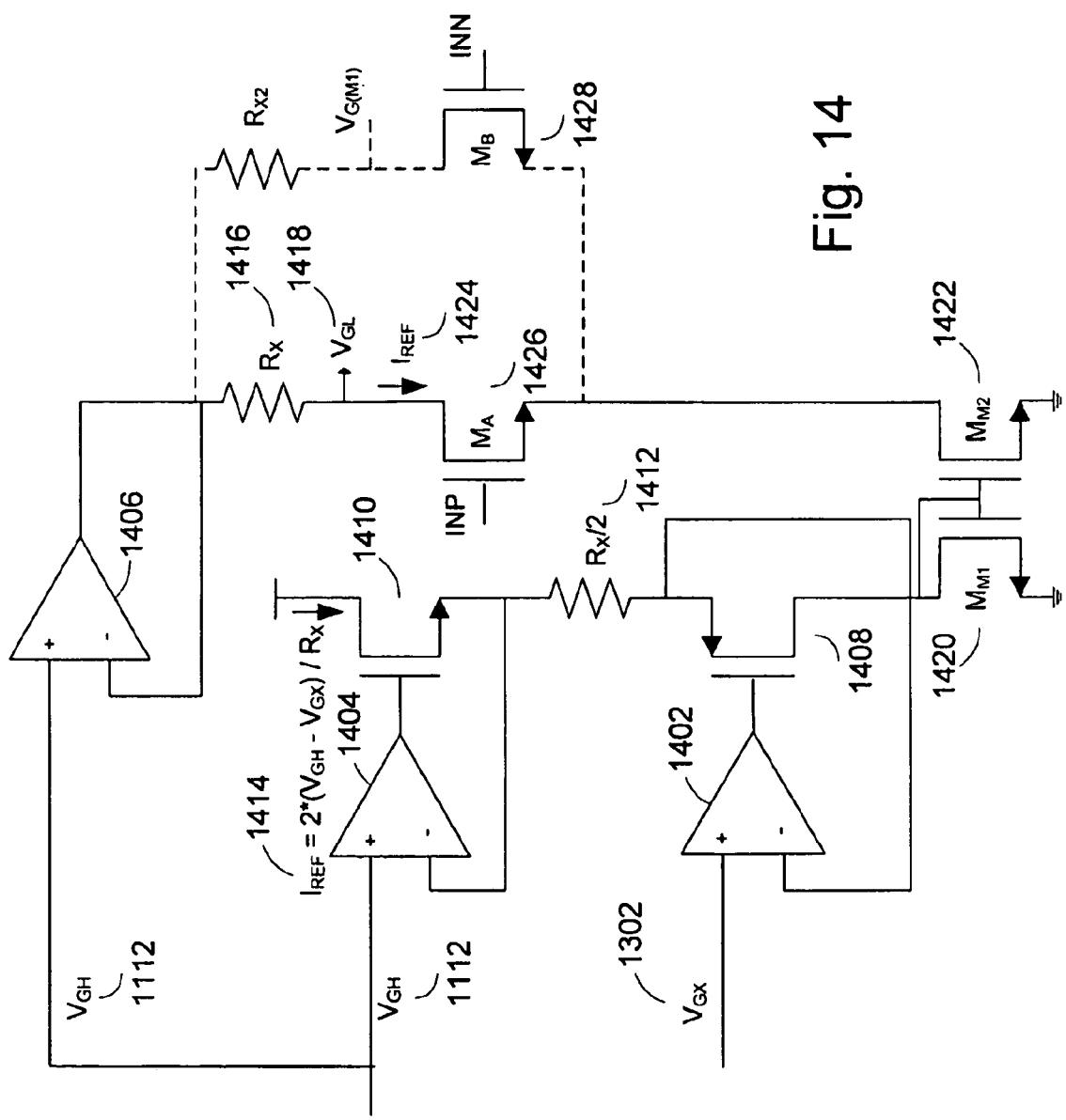
FIG. 14 illustrates an example of a biasing circuit that is configured to generate a reference for a low voltage level $V_{GL}$ from a reference for a high voltage level $V_{GH}$ and a second voltage $V_{Gx}$.

FIGS. 13 and 14 illustrate an example of a biasing circuit that generates a relatively low, such as minimal, pre-driver output swing voltage ($V_{GHIGH}$-$V_{GLOW}$) that still fully commutates the output differential pair by using replica circuits to generate $V_{GHIGH}$ and $V_{GLOW}$. While the biasing circuit is illustrated in the context of a modification to the circuit described in connection with FIG. 11A, it will be understood by one of ordinary skill in the art that the biasing circuit can also be adapted to the embodiments described earlier in connection with FIGS. 7, 9, and 10.

Saturation Control Via Regulation of the Differential Pair Source Voltage $V_{S(M1,M2)}$ For a relatively constant drain voltage, the drain-source voltage $V_{DS}$ of a transistor in a differential pair is relatively higher when the source voltage $V_S$ is relatively lower. An increase in the drain-source voltage $V_{DS}$ increases the likelihood that the device will operate in the saturation region as explained earlier in connection with Equation 1. To achieve a relatively high drain-source voltage $V_{DS}$, the source voltage $V_S$ should accordingly be lowered (for N-type devices). However, it should be noted that too low a source voltage $V_{S(M1, M2)}$ for the differential pair may impair the operation of the current source for the differential pair. Thus, the lowering of the source voltage $V_S$ should be carefully controlled.

Figure 7:
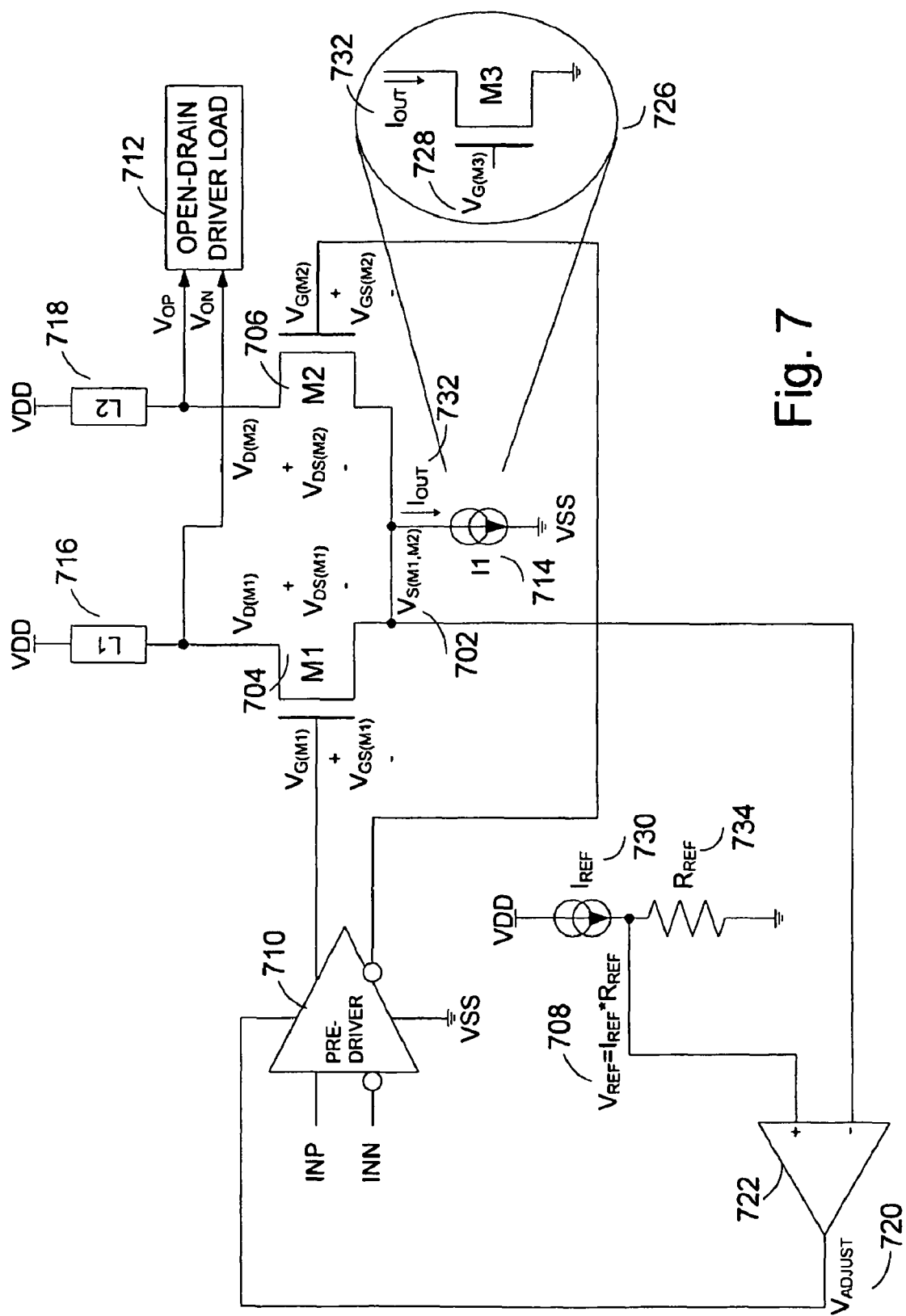
FIG. 7 illustrates an example of saturation control by regulation of the source voltage of a differential pair.
Figure 8:
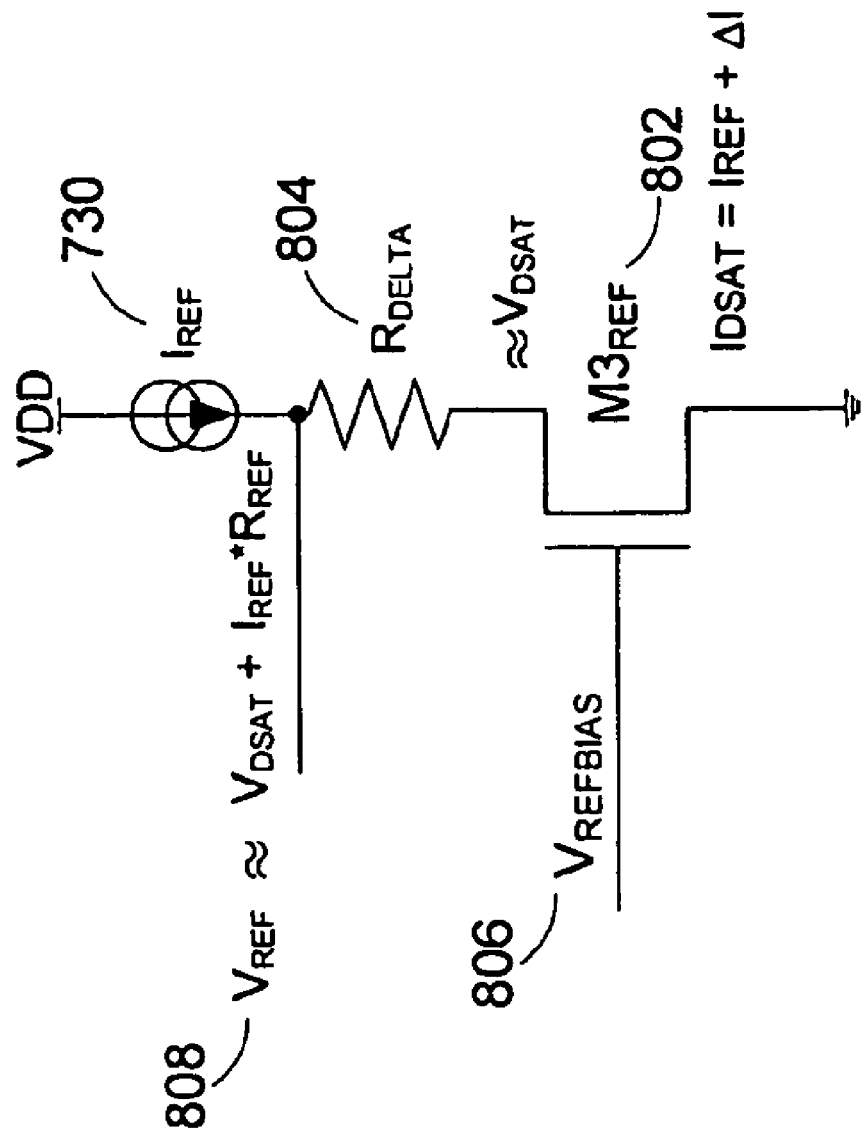
FIG. 8 illustrates an example of generation of a voltage reference $V_{REF}$.

FIG. 7 illustrates an example of saturation control by regulation of the source voltage $V_{S(M1,M2)}$ 702 of the transistors of a differential pair M1 704, M2 706. The transistors M1 704, M2 706 are in a source-coupled configuration. The source voltage $V_{S(M1,M2)}$ 702 is regulated to be approximately equal to a voltage reference $V_{REF}$ 708. Those skilled in the art will recognize that this circuit can be built in a nearly infinite number of ways. One advantageous attribute is the process of maintaining the saturation of the transistors in the differential pair M1 704, M2 706 by regulating the source voltage $V_{S(M1, M2)}$ 702 through the active adjustment of the corresponding high gate voltage ($V_{GHIGH}$) used to drive the transistors M1 704, M2 706.

Figure 1:
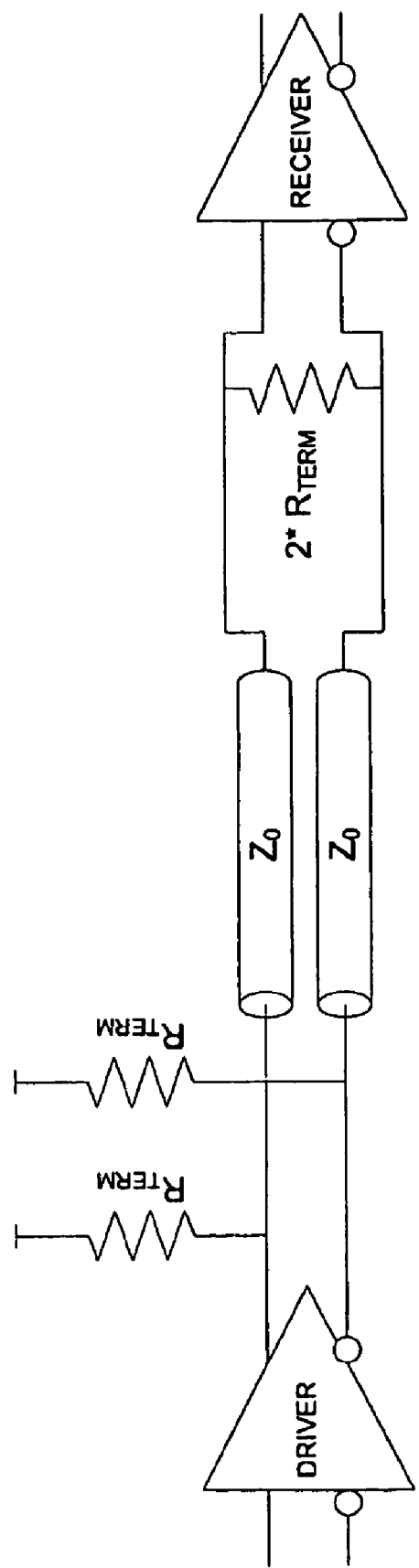
FIG. 1 illustrates an example of a double-terminated differential link.

In FIG. 7, the differential data or signal (INP and INN) is buffered by a pre-driver circuit 710 and applied as inputs $V_{G(M1)}$ and $V_{G(M2)}$ to the differential pair M1 704, M2 706 of the differential output stage or open-drain driver, which then generates a differential output signal $V_{OP}$, $V_{ON}$ for the open-drain driver load 712. The pre-driver circuit 710 applies a high voltage level $V_{GHIGH}$ or a low voltage level $V_{GLOW}$ to the differential pair transistors M1 704, M2 706 in the open-drain driver based on the value of INP and INN. The differential output signal $V_{OP}$, $V_{ON}$ is generated by switching the current $I_{Out}$ produced by the source $I_1$ 714 across an output load, represented by internal loads L1 716 and L2 718, and by the external open-drain driver load 712, which can correspond to a termination at a receiver as described earlier in connection with FIG. 1.

The voltage $V_{ADJUST}$ 720 is used to adjust the gate drive provided by the pre-driver circuit 710 as described in further detail below. It should be noted that the pre-driver circuit 710, as well as other pre-driver stages and circuits disclosed herein, can also include buffering circuitry and/or amplification circuitry for reference levels, such as the voltage $V_{ADJUST}$ 720. The illustrated embodiment can operate with any type of internal or external load, and advantageously does not require a specific type of load.

A negative feedback loop using an operational amplifier 722 can be configured to adjust the high output level $V_{GHIGH}$, both the high and low output levels, or even a common-mode signal adjusting the high output level $V_{GHIGH}$, or both the high output level $V_{GHIGH}$ and the low output level $V_{GLOW}$. In the illustrated embodiment of FIG. 7, the high output level $V_{GHIGH}$ is adjusted with a voltage adjustment signal $V_{ADJUST}$ 720 so that the average of the source voltage $V_{S(M1,M2)}$ (used as a sense signal) of the differential pair transistors $V_{S(M1,M2)}$ is set at or close to the voltage reference $V_{REF}$ 708. When the average source voltage $V_{S(M1,M2)}$ is higher than the voltage reference $V_{REF}$, the feedback loop via the voltage adjustment signal $V_{ADJUST}$ 720 lowers either the high output voltage level $V_{GHIGH}$ or both the high and low output voltage levels $V_{GHIGH}$, $V_{GLOW}$ switched to the outputs $V_{G(M1)}$, $V_{G(M2)}$ of the pre-driver circuit 710. Conversely, when the average source voltage $V_{S(M1,M2)}$ is lower than the voltage reference $V_{REF}$ 708, the feedback loop increases either the high output voltage level $V_{GHIGH}$ or both the high and low output voltages $V_{GHIGH}$, $V_{GLOW}$ switched by the pre-driver circuit 710. As the gate-to-source voltage $V_{GS}$ of transistors M1 704, M2 706 is relatively constant for a given current, the average $V_{S(M1,M2)}$ can be controlled through the gate voltages $V_{G(M1)}$ and $V_{G(M2)}$ of transistors M1 704 and M2 706, respectively. The averaging of the source voltage $V_{S(M1,M2)}$ can be performed by limiting the bandwidth of the feedback loop to a frequency high enough to track the voltage and temperature variations, but low enough to reject signal dependent variations.

Transistor M3 726 illustrates a possible implementation of an open-drain driver current source for current source $I_1$ 714. Transistor M3 726 is biased by a gate voltage $V_{G(M3)}$ 728. In this specific case, the voltage reference $V_{REF}$ 708 is selected to maintain transistor M3 726 in the saturation region across process, voltage, and temperature variations (PVT). For other current source implementations, the voltage reference $V_{REF}$ 708 is generally chosen to ensure a correct operation of current source across PVT. Advantageously, the actual value selected for the voltage reference $V_{REF}$ 708 can vary widely because for a value of the voltage reference $V_{REF}$ lower than the lowest level of the output voltages $V_{OP}$ or $V_{ON}$, there exist dimensions for transistors M1 and M2 for which they will be maintained in saturation across PVT variations by the illustrated biasing techniques. However, it should also be noted if the voltage reference $V_{REF}$ is selected to be close to the lowest level of $V_{OP}$ or $V_{ON}$, then transistors M1 704 and M2 706 may have to be undesirably large to assure operation in the saturation region.

The voltage reference $V_{REF}$ 708 in FIG. 7 can be set to a value for correct operation of the current source $I_1$ 714 across anticipated process, voltage, and temperature variations (PVT) or to a value that varies with PVT by making a reference current $I_{REF}$ 730 proportional to the voltage used to keep current source $I_1$ 714 in the correct operation region. A circuit that performs this current reference $I_{REF}$ 730 adjustment will be described in greater detail later in connection with FIG. 12. In addition, other techniques can be used to generate the voltage reference $V_{REF}$ 708. Examples of other techniques include use of a bandgap source, a resistor divider from the supply voltage, and the like.

In the illustrated embodiment of FIG. 7, the feedback loop regulates the source voltage $V_{S(M1,M2)}$ 702 of the differential pair transistors M1 704, M2 706 of the open-drain driver.

In another embodiment (not illustrated), the feedback loop regulates the source voltage of the differential pair transistors of a replica open-drain driver. Such an implementation still maintains the saturation of the transistors in the differential pair by regulating their source voltage through the active adjustment of their maximum gate voltage (i.e. high level of the pre-driver, $V_{GHIGH}$).

The illustrated embodiment advantageously increases, such as maximizes, the drain-to-source voltage $V_{DS}$ of the differential pair. However, it may also generate a relatively large reduction in the gate voltages ($V_{GHIGH}$ and $V_{GLOW}$, as applicable) of the differential pair transistors in fast PVT corners, which can make the generation of these gate voltages by the pre-driver circuit 710 relatively difficult and can complicate the design of the pre-driver circuit 710. Other embodiments disclosed herein can be used with more readily realizable pre-driver architectures that use significant headroom for proper operation. In one embodiment, a replica circuit, such as the circuit that will be described later in connection with FIG. 11A, can be used in place of the feedback loop.

Voltage Reference Generation

FIG. 8 illustrates an example of generation of a voltage reference $V_{REF}$ 808 that can be used instead of the voltage reference $V_{REF}$ 708 of FIG. 7. In FIG. 8, a transistor $M3_{REF}$ 802 replicates M3 726 and is connected below resistor $R_{DELTA}$ 804 (typically different from $R_{REF}$ 734 of FIG. 7) to generate the voltage reference $V_{REF}$ 808. Transistor $M3_{REF}$ 802 can be biased such that it would require slightly more current than produced by reference current $I_{REF}$ 730 to keep it saturated, provided that reference current $I_{REF}$ 730 has a relatively high output impedance. For example, this can be done by setting $V_{REFBIAS}=V_{G(M3)}$, by scaling transistor $M3_{REF}$ 802 to the same size as transistor M3 726, and by setting the reference current $I_{REF}$ 730 lower than the current $I_{OUT}$ 732. The gate voltage $V_{REFBIAS}$ 806 of transistor $M3_{REF}$ 802 can be set to the same voltage as the gate voltage $V_{G(M3)}$ 728 of transistor M3 726 by, for example, tying the gates to the same potential. Under these conditions, transistor $M3_{REF}$ 802 uses a current larger than $I_{REF}$ to be in saturation ($I_{DSAT}=I_{REF}+\Delta I$), and the generated voltage on the drain of transistor $M3_{REF}$ 802 will be slightly below $V_{DSAT}$. The current passing through resistor $R_{DELTA}$ 804 produces an additional voltage drop that makes voltage reference $V_{REF}$ 808 equal to or slightly larger than $V_{DSAT}$. Those skilled in the art will find that many different implementations of such a circuit are possible, such as by varying appropriately any of $V_{REFBIAS}$ 806, the scale of transistor $M3_{REF}$ 802, or changing the reference current $I_{REF}$ 730 amplitude such that transistor $M3_{REF}$ 802 tracks well the characteristics of transistor M3 726 but is kept slightly below saturation.

Figure 9:
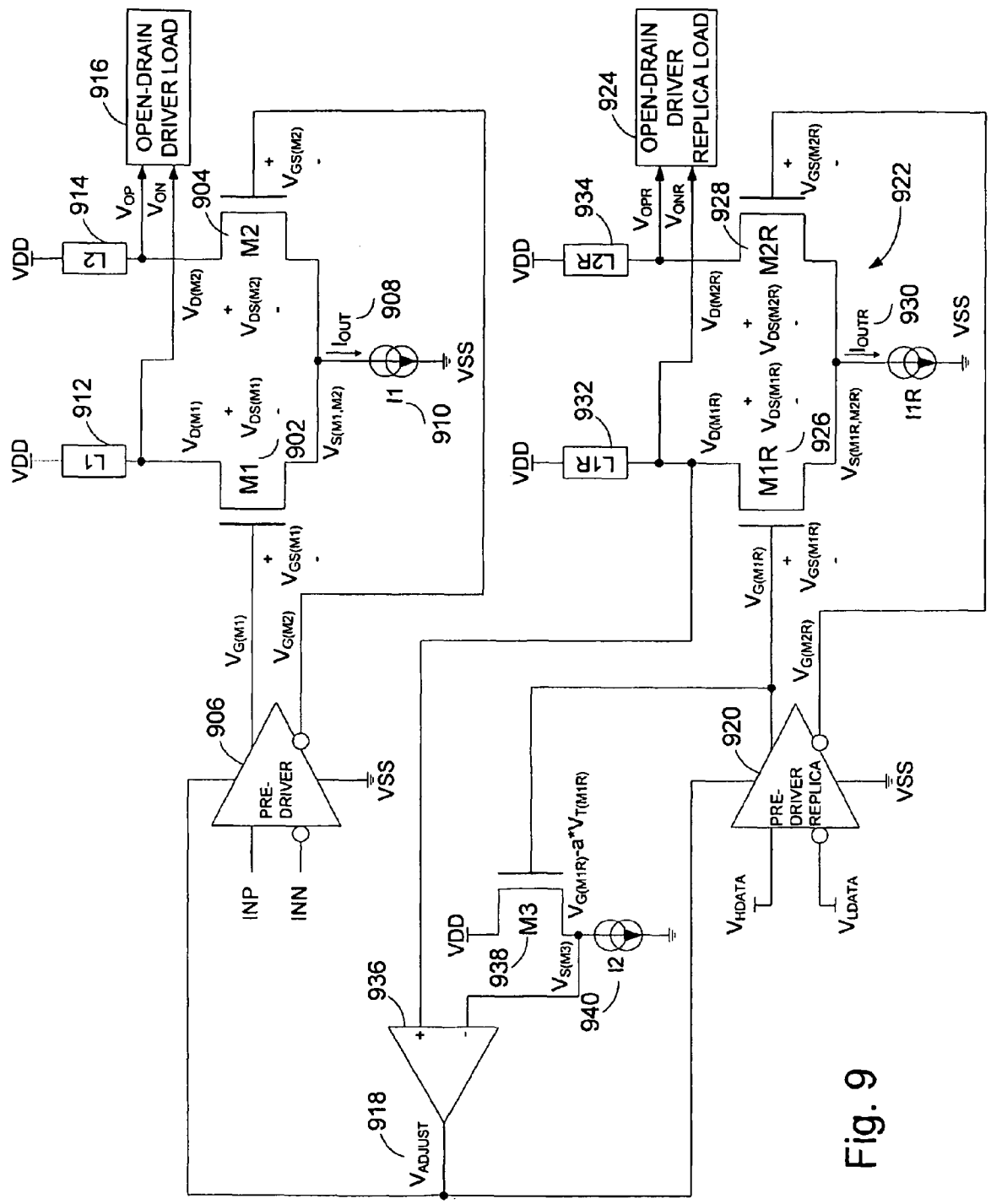
FIG. 9 illustrates an example of saturation control using a threshold voltage $V_T$ generator.

Saturation Control Via Regulation of the Drain Voltage of a Replica Circuit Using a $V_T$ Generator FIG. 9 illustrates an example of saturation control using a threshold voltage $V_T$ generator. Advantageously, the illustrated embodiment can operate with a broad variety of internal and external loads that exhibit a resistive behavior. As will be explained later, some of the components illustrated in FIG. 9 are optional. The illustrated embodiment takes a direct approach to the control of the saturation of the differential pair transistors M1 902, M2 904 by enforcing the condition for transistor saturation, repeated below in Equation 4 (same as Equation 1).

$$V_{DS} \geq V_{GS} - V_T \quad \text{Equation 4}$$

Equation 4 can be expanded as expressed in Equation 5.

$$V_D - V_S \geq (V_G - V_S) - V_T \quad \text{Equation 5}$$

Equation 5 can be simplified to Equation 6.

$$V_D \geq V_G - V_T \quad \text{Equation 6}$$

In FIG. 9, the differential data or signal (INP and INN) is buffered by a pre-driver circuit 906, which drives inputs of the differential output stage including the differential pair transistors M1 902, M2 904, which generate the differential output signal $V_{OP}$ and $V_{ON}$. The pre-driver circuit 906 applies a high voltage level $V_{GHIGH}$ or a low voltage level $V_{GLOW}$ as applicable to the differential pair transistors M1 902, M2 904 in the open-drain driver based on the value of INP and INN. The differential output signal $V_{OP}$ and $V_{ON}$ is generated by switching the current $I_{OUT}$ 908 produced by the source $I_1$ 910 across an output load, represented here by internal loads L1 912 and L2 914 and by an external open-drain driver load 916. The voltage $V_{ADJUST}$ 918 is used to adjust the gate drives provided by the pre-driver circuit 906 as described in further detail below.

The embodiment illustrated in FIG. 9 uses a replica 920 of the pre-driver circuit 906, a replica 922 of the open-drain differential stage, and a replica 932, 934, 924 of its loads 912, 914, 916. Selected components that are part of this replica are identified by the "R" suffix in FIG. 9. This replica circuit is typically a scaled-down copy of the open-drain driver. For example, for a scaling factor of m, the width (W) of transistors M1R 926 and M2R 928 is equal to the width of transistors M1 902 and M2 904 divided by m ($W_{M1R}=W_{M1}/m$). In the same manner, the replica current $I_{OUTR}$ 930 is $I_{OUT}/m$, and the impedance of the loads L1R 932 and L2R 934 is about m times larger than the impedance of loads L1 912 and L2 914.

The replica 924 of the open-drain driver load 916 is also used and can be internal to the chip, with an equivalent resistance m times larger than that expected for the original open-drain driver load 916. When the open-drain driver load 916 is external to the chip or integrated circuit, it will be understood that the resistance of the open-drain driver replica load 924 will typically not track that of the open-drain driver load 916. In that case, the open-drain driver replica load 924 can be set to match the resistance of the open-drain driver load 916 under typical or expected process and operating conditions. The devices within the replica pre-driver circuit 920 can also be scaled in the same manner as the devices of the replica open-drain driver 922.

In the replica circuit, the gate voltage $V_{G(M1R)}$ of replica transistor M1R 926 is forced to the high output level of the pre-driver replica circuit 920, which matches the high output level of the main pre-driver circuit 906.

The gate voltage $V_{G(M2R)}$ of replica transistor M2R 928 is forced to the low output level $V_{GLOW}$ of the pre-driver replica circuit 920, which matches the low output level of the main pre-driver circuit 906. It will be understood by the skilled practitioner that because replica transistor M2R 928 is "off" or non-conducting, that the replica circuit can be formed without replica transistor M2R 928, which can then be considered optional. It will also be apparent that replica loads L1R 932, L2R 934, and open-drain driver replica load 924 can also then be combined. However, it should also be noted that the presence of replica transistor M2R 928 is beneficial to the circuit to match leakage currents.

Accordingly, the drain voltage $V_{D(M1R)}$ of replica transistor M1R 926 is set approximately to the low output level of the outputs $V_{OP}$ and $V_{ON}$ of the open-drain differential driver, and the operation of transistors M1 902 and M2 904 in the saturation region (when active) can be achieved when the replica transistor M1R 926 is operating in the saturation region.

A feedback loop using an operational amplifier 936 generates the adjustment voltage $V_{ADJUST}$ 918. Depending on the configuration of the pre-driver circuit 906 and the replica pre-driver circuit 920, the adjustment voltage $V_{ADJUST}$ 918 can adjust the high output level ($V_{GHIGH}$), both the high and low output levels ($V_{GHIGH}$ and $V_{GLOW}$), a common-mode signal generating either or both the high output level and the low output level, and the like, for the pre-driver circuit 906.

The feedback loop operates such that the drain voltage $V_{D(M1R)}$ of the replica transistor M1R 926 is at approximately the same potential as the source voltage $V_{S(M3)}$ of transistor M3 938. As will be explained in further detail, the source voltage $V_{S(M3)}$ of transistor M3 938 is configured to be equal to $V_{G(M1R)} - a^* V_{T(M1R)}$ to satisfy the condition expressed in Equations 1 and 4 for saturation of the replica transistor M1R 926.

Accordingly, the source voltage $V_{S(M3)}$ is set at or close to $V_{G(M1R)} a^* V_{T(M1R)}$, where "a" is typically between 0.8 and 1, and $V_T$ is the threshold voltage of the replica transistor M1R 926. When the drain voltage $V_{D(M1R)}$ of the replica transistor M1R 926 is lower than $V_{G(M1R)} - a^* V_{T(M1R)}$, the feedback loop lowers the high output voltage or both the high and low output voltages of the pre-driver circuit 906 and the replica pre-driver circuit 920. Conversely, when the drain voltage $V_{D(M1R)}$ of the replica transistor M1R 926 is higher than $V_{G(M1R)} - a^* V_{T(M1R)}$, the feedback loop increases the high output voltage or both the high and low output voltages of the pre-driver circuit 906 and the replica pre-driver circuit 920. By maintaining the drain voltage $V_{D(M1R)}$ about equal to $V_{G(M1R)} - a^* V_{T(M1R)}$, saturation of the replica transistor M1R 926 can be achieved for values of "a" less than or equal to 1 (Equation 7).

$$V_{D(M1R)} \approx V_{G(M1R)} - a^* V_{T(M1R)} \geq V_{G(M1R)} V_{T(M1R)} \quad \text{Equation 7}$$

The $a^* V_T$ voltage drop is obtained through a $V_T$ generator made of transistor M3 938 and current source I2 940, where transistor M3 938 is a scaled replica of transistor M1 902. The current generated by the current source I2 940 is calibrated to operate the transistor M3 938 at its threshold or slightly in the sub-threshold region, which typically sets a to a value between 0.8 and 1.

It will be understood by one of ordinary skill in the art that the principles and advantages of the embodiment described in connection with FIG. 9 can be varied in a very broad variety of ways. Saturation (when "on") of the transistors of the differential pair of the driver is maintained by regulating a drain voltage $V_D$, such as the drain voltage of a replica transistor, so that the drain voltage $V_D$ remains higher than its gate voltage minus a fraction of their threshold voltage ($V_G - a V_T$) using the active adjustment of the high voltage level $V_{GHIGH}$ of the pre-driver circuit 906. As discussed earlier, in another embodiment, the active branch of the replica circuit is used and the inactive branch is not present, i.e., only replica transistor M1R 926 of the replica differential pair is used. This is practical provided leakage currents through the other branch through replica transistor M2R 928 can be ignored or otherwise compensated. In addition, those skilled in the art will recognize that other replica circuit configurations can also create matched voltages.

Figure 10:
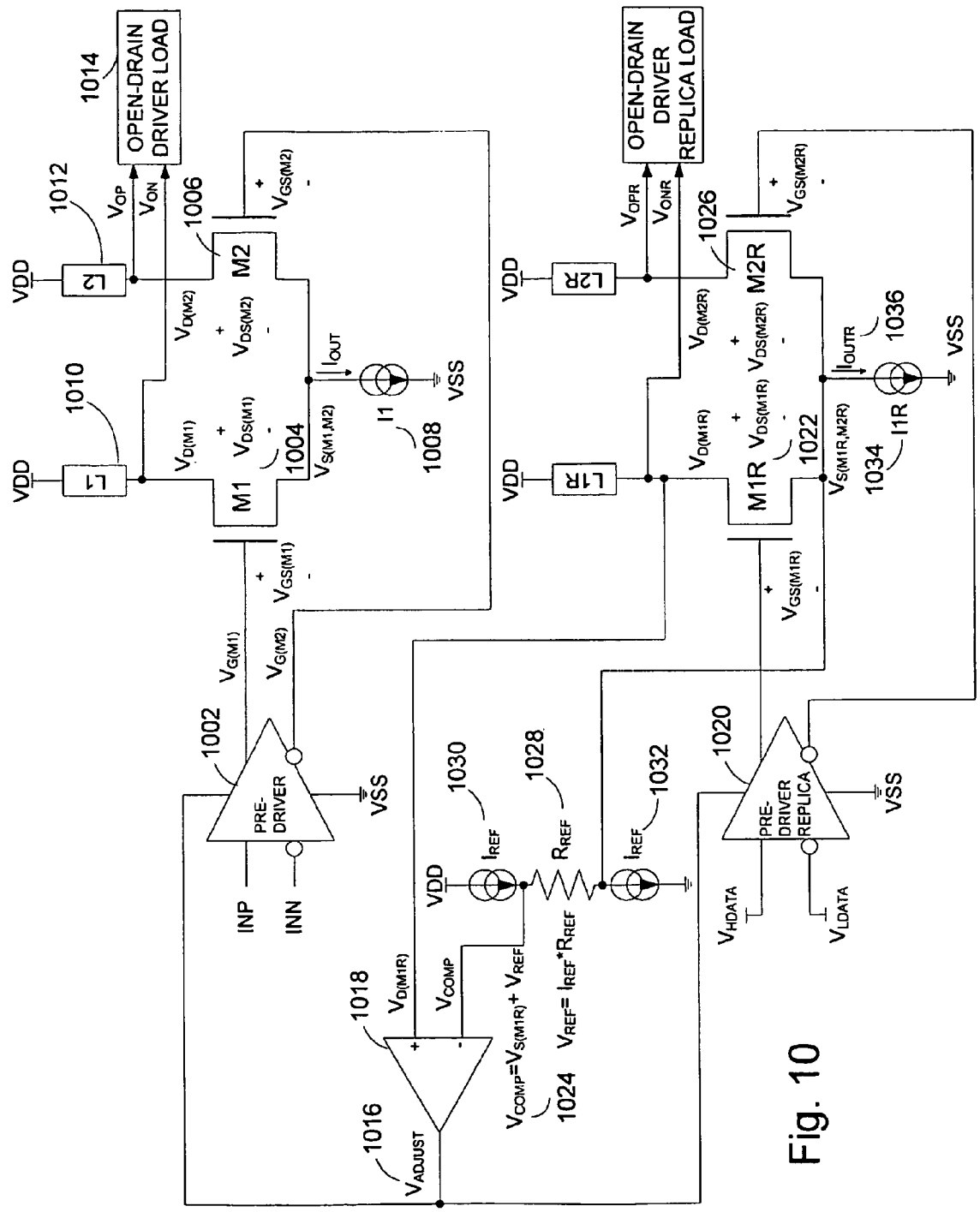
FIG. 10 illustrates an example of controlling operation in the saturation region by regulating a drain-to-source voltage of a replica circuit.

Saturation Control Via Regulation of the Drain-Source Voltage of a Replica Circuit FIG. 10 illustrates an example of controlling operation in the saturation region by regulating a drain-to-source voltage of a replica circuit. The illustrated embodiment uses a replica of the pre-driver circuit, of the open-drain differential stage and of its loads, as does the embodiment described earlier in connection with FIG. 9. The description of the replica components of FIG. 9 also applies to the replica components of FIG. 10. With respect to scaling, the replica circuit illustrated in FIG. 10 can follow the same scaling guidelines discussed earlier in connection with FIG. 9. Advantageously, the illustrated embodiment can operate with a broad variety of internal and external loads that exhibit a resistive behavior.

In the illustrated circuit, the differential data or signal (INP and INN) is buffered by a pre-driver stage 1002, which drives the differential pair transistors M1 1004, M2 1006 of the output stage, which generates the differential output signal ($V_{OP}$ and $V_{ON}$). The pre-driver stage 1002 applies a high voltage level $V_{GHIGH}$ or a low voltage level $V_{GLOW}$, as applicable, to the differential pair transistors M1 1004 and M2 1006 in the open-drain driver based on the value of INP and INN. The differential output signal $V_{OP}$ and $V_{ON}$ is generated by switching the current $I_{OUT}$ produced by the source $I_1$ 1008 across an output load, illustrated in FIG. 10 by internal loads L1 1010 and L2 1012, and by an external open-drain driver load 1014. The voltage $V_{ADJUST}$ 1016 is used to adjust the gate drive provided by the pre-driver stage 1002, as described in further detail below.

A feedback loop with an operational amplifier 1018 adjusts the high output level ($V_{GHIGH}$) or both the high and low output levels ($V_{GHIGH}$ and $V_{GLOW}$) of a replica pre-driver stage 1020 so that a drain-to-source voltage $V_{DS(M1R)}$ of a replica transistor M1R 1022 is maintained at a relatively constant value. The voltage $V_{ADJUST}$ 1016 is also provided as an input to the pre-driver stage 1002 to correspondingly maintain the drain-to-source voltages $V_{DS(M1)}$ and $V_{DS(M2)}$ of the differential pair M1 1004 and M2 1006.

The feedback loop maintains the drain-to-source voltage $V_{DS(M1R)}$ relatively constant by regulating the drain voltage $V_{D(MIR)}$ with reference to a voltage $V_{COMP}$ 1024, which is equal to the voltage at the source of the replica transistors M1R 1022 or M2R 1026 $V_{S(M1R,M2R)}$ plus an offset voltage $V_{REF}$. Offset voltage $V_{REF}$ is determined by the current $I_{REF}$ flowing through the resistor $R_{REF}$ 1028 and is set to a value sufficient to keep replica transistor M1R 1022 in the saturation region. To generate current $I_{REF}$, two current sources 1030, 1032 are used to not affect currents at the source node of the replica differential pair, and to accordingly not affect the voltage at the source $V_{S(M1R,M2R)}$. A current sink I1R 1034 provides a sink for a current $I_{OUTR}$ 1036 from the source node. As described earlier in connection with the replica circuit of FIG. 9, maintaining replica transistor M1R 1022 in saturation is sufficient to achieve saturation in transistors M1 1004 and M2 1006 while in operation.

When the drain voltage $V_{D(M1R)}$ is lower than $V_{COMP}$ 1024, the feedback loop lowers the high output voltage or both the high and low output voltages of the pre-driver stage 1002 and the replica pre-driver stage 1020. When the drain voltage $V_{D(M1R)}$ is higher than $V_{COMP}$ 1024, the feedback loop increases the high output voltage or both the high and low output voltages of the pre-driver stage 1002 and the replica pre-driver stage 1020.

The reference voltage $V_{REF}$ in FIG. 10 can be set to a value that achieves saturation of replica transistor M1R 1022 across process, voltage, and temperature variations (PVT) or to a value that varies with PVT by making $I_{REF}$ proportional to the saturation voltage of replica transistor M1R 1022. An example of a circuit that provides such a reference current $I_{REF}$ will be described in greater detail later in connection with FIG. 12. Other circuits that can provide this function will be readily determined by one of ordinary skill in the art.

It will be appreciated by one of ordinary skill in the art that the embodiment illustrated FIG. 10 can be varied in a very broad number of ways. Saturation of the transistors in the differential pair is maintained by regulating a drain-source voltage of a replica transistor through the active adjustment of a high voltage level used to drive a gate of a transistor (i.e. high level of the pre-driver, $V_{GHIGH}$). In addition, in one embodiment, the replica transistor M2R 1026 is optional as it is "cut off." However, as mentioned earlier in connection with FIG. 9, where a cutoff replica transistor is not used, care should be taken to account for leakage currents.

Saturation Control Via Generation of the Pre-Driver High Voltage by a Replica of the Differential Pair FIG. 11A illustrates an example of a biasing circuit using a replica of a differential pair transistor in an open-loop manner to control the level of the "high" voltage $V_{GHIGH}$ used to drive the inputs of differential pair as described earlier in connection with FIG. 5. Advantageously, the embodiment illustrated in FIG. 11A does not use an operational amplifier and global feedback. The components of the differential driver can be the same as those described earlier in FIG. 7 (as well as other Figures), and the reference numbers will be reused for convenience and to avoid repetition. FIGS. 13 and 14 illustrate an extension to the embodiment illustrated in FIG. 11A, in which both the low level $V_{GLOW}$ and the high voltage level $V_{GHIGH}$ are controlled.

A high gate voltage $V_{GHIGH}$ is generated by a replica transistor MR1 1102 of transistor M1 704 or M2 706. Resistor $R_{REF}$ 1104 is selected similarly as described in connection with the voltage reference $V_{REF}$ 708 of FIG. 7 to generate a relatively low or minimal source voltage $V_{S(M1,M2)}$ that will keep transistor M3 726 operating in the saturation region. $I_{REF}$ 1106 is a replica of the current $I_{OUT}$ 732 and can be scaled with respect to current $I_{OUT}$ 732 if desired. When scaled, the equivalent width of the replica transistor MR1 1102 should also be scaled from the equivalent width of transistor M1 704 or M2 706 in the same proportions as the ratio $I_{REF}/I_{OUT}$, or with a slightly smaller ratio to account for some margin.

An optional resistor $R_D$ 1108 can be used to reduce second-order effects stemming from the finite output impedance of the replica transistor MR1 1102. It advantageously reproduces the same or similar drain voltage as what should be observed on transistor M1 704 or M2 706.

This illustrated circuit advantageously generates an appropriate high voltage level ($V_{GHIGH}$) for the pre-driver circuit 1110 without using a relatively complicated feedback loop with relatively high loop gain. A voltage reference $V_{GH}$ 1112 for the pre-driver circuit 1110 is provided by the connection between the drain (through resistor $R_D$ 1108) and the gate of replica transistor MR1 1102. It should be noted that the pre-driver circuit 1110 should buffer the voltage reference $V_{GH}$ 1112 to use the voltage reference $V_{GH}$ 1112 to set the high voltage level $V_{GHIGH}$ for the outputs of the pre-driver circuit 1110. The pre-driver circuit 1110 can also be configured to amplify the voltage reference $V_{GH}$ 1112.

It will be appreciated by one of ordinary skill in the art that the embodiment illustrated in FIG. 11A can be varied in a very broad number of ways. Saturation of the driver transistors of the differential pair is maintained by mirroring a gate voltage $V_{GH}$ of a biased replica transistor MR1 1102 that is matched to the transistors of the differential pair. In one embodiment, the replica transistor MR1 1102 is biased in the saturation region.

A circuit that can replace resistor $R_{REF}$ 1104 is illustrated in FIG. 11B (with other components from the circuit of FIG. 11A). The circuit is similar to that described earlier in connection with FIG. 8 and can be used to replace the resistor $R_{REF}$ 1104 to generate a biasing that will keep transistor M3 726 saturated. The same considerations the components $R_{DELTA}$ 1114 ($R_{DELTA}$ 804 in FIG. 8), M3$_{REF}$ 802 and $V_{REFBIAS}$ 806 described in connection with FIG. 8 should be taken into account such that transistor M3$_{REF}$ 802 operates slightly below its saturation region. In addition, however, current $I_{REF}$ 1106 also impacts transistor MR1 1102, so it will typically be more efficient to adjust $V_{REFBIAS}$ 806 or scale the size of transistor M3$_{REF}$ 802 rather than to modify the current $I_{REF}$ 1106. The reference voltage $V_{GH}$ 1116 generated by the circuit of FIG. 11B can be used in place of the reference voltage $V_{GH}$ 1112 in FIG. 11A.

Generation of $I_{REF}$ to Track PVT Variations

In the embodiments described in connection with FIGS. 7 and 10, a reference current $I_{REF}$ passes through a resistance $R_{REF}$ to generate a reference voltage $V_{REF}$. This reference voltage $V_{REF}$ is used, directly or indirectly, to maintain the drain-source voltage $V_{ds}$ of a target transistor to keep the target transistor in saturation across process voltage and temperature (PVT) variations. Given that the saturation voltage $V_{SAT}$ of transistors varies with process, temperature and their biasing current, it is desirable to design a voltage reference $V_{REF}$ that tracks the changing saturation voltage $V_{DSAT}$ of the target transistor.

FIG. 12 illustrates an example of a circuit that generates a reference current $I_{REF}$ 1202 that is proportional to the saturation voltage $V_{DSAT}$ of a target transistor $V_{DSAT(TARGET)}$. The illustrated circuit corresponds to a current sink for the reference current $I_{REF}$. It will be understood that current mirror circuits can be used to generate a current source from the current sink. Diode-connected replica transistors M4R 1204 and M5R 1206 are matched replicas of the target transistor and are biased respectively with current $I_{TARGET}$ 1208 and current $I_{TARGET/4}$ 1210. In the illustrated embodiment, current $I_{TARGET}$ 1208 is a replica of the biasing current of the target transistor, and current $I_{TARGET/4}$ 1210 is one-fourth of the biasing current of the target transistor. As will be discussed later, the principles of the circuit can be applied with other scaling factors, which will be readily determined by one of ordinary skill in the art.

Through voltage follower loops, the gate voltages of replica transistor M4R 1204 and replica transistor M5R 1206, i.e., $V_{GST(M4R)}$ and $V_{GST(M5R)}$, respectively, are applied across a resistor of value $R_{REF/2}$ 1212. The illustrated voltage followers include a first operational amplifier 1214 driving an NMOS transistor 1216, and a second operational amplifier 1218 driving a PMOS transistor 1220. Sizing of the NMOS transistor 1216 and of the PMOS transistor 1220 is not critical.

Due to matching for the replica transistor M4R 1204 and the replica transistor M5R 1206, the relationship expressed in Equation 8 holds for both transistors.

$$I_D = K(V_{GS} - V_T)^2 \qquad \text{Equation 8}$$

The effective gate voltage of replica transistor M5R 1206 is expressed in Equations 9A and 9B.

$$V_{GST(M5R)} = V_{GS(M5R)} - V_T \qquad \text{Equation 9A}$$

$$V_{GST(M5R)} = \sqrt{I_{TARGET}/4K} = \frac{\sqrt{I_{TARGET}/K}}{2} = \frac{V_{GST(M4R)}}{2} \qquad \text{Equation 9B}$$

The reference current $I_{REF}$ 1202 is then expressed by Equations 10A-10C.

$$I_{REF} = (V_{GS(M4R)} - V_{VGS(M5R)})/(R_{REF}/2) \approx 2(V_{GST(M4R)} - V_{GST(M5R)})/R_{REF} \qquad \text{Equation 10A}$$

$$I_{REF} = V_{GST(M4R)}/V_{GST(M4R)}/2)/R_{REF} \qquad \text{Equation 10B}$$

$$I_{REF} = V_{GST(M4R)}/R_{REF} = V_{DSAT(M4R)}/R_{REF} \approx V_{DSAT(TARGET)}/R_{REF} \qquad \text{Equation 10C}$$

When applied through a matched resistor with resistance $R_{REF}$, the reference current $I_{REF}$ 1202 produces a reference voltage $V_{REF}$ proportional to the saturation voltage $V_{DSAT}$ of the target transistor.

When applied to the embodiment described earlier in connection with FIG. 7, replica transistor M4R 1204 and replica transistor M5R 1206 should be matched (and scaled as appropriate) to transistor M3 726, and current $I_{TARGET}$ 1208 should be matched to current $I_{OUT}$ 732.

When applied to the embodiment described earlier in connection with FIG. 10, replica transistor M4R 1204 and replica transistor M5R 1206 should be matched to replica transistor M1R 1022 and replica transistor M2R 1026, and current $I_{TARGET}$ 1208 should be matched to $I_{OUTR}$ 1036, which corresponds to the current through current sink I1R 1034. In addition, body effects should be considered in this case.

It will be appreciated by one of ordinary skill in the art that the embodiment illustrated in FIG. 12 can be varied in a very broad number of ways. A voltage reference $V_{REF}$ can be generated from the reference current $I_{REF}$ 1202. The reference current $I_{REF}$ 1202 and accordingly, the voltage reference $V_{REF}$ can advantageously maintain proportionality to the saturation voltage $V_{DSAT}$ of target transistors in embodiments described earlier in connection with FIGS. 7, 10, 11A, and 13. The target transistors can include, for example, the current mirror circuits including transistor M3 726 of FIG. 7 used for sinking current from the differential pair, to the current sink I1R 1034 of a replica differential pair, and the like.

In the illustrated embodiment, the generation of a saturation voltage $V_{DSAT}$ tracking reference current $I_{REF}$ 1202 is achieved by generating the saturation voltage $V_{DSAT}$ voltage through the difference of two replica circuits. The illustrated circuit can be varied in a number of ways without departing from the circuit's principles of operation, such as, for example, by changing scaling. In an alternative embodiment, the same current, e.g., $I_{TARGET}$ 1208, is used for both transistors M4R 1204 and M5R 1206, and the effective width of transistor M5R 1206 is increased by a scale factor of four. Using current or transistor ratios larger than four can also be used to provide some margin. Furthermore, setting the source voltage of transistors M4R 1204 and M5R 1206 to a replica of the source voltage of the differential pair can reduce the body effect of embodiments according to FIG. 10.

Control of Low Voltage Level $V_{GLOW}$

FIG. 13 illustrates an example of a biasing circuit using replicas of a differential pair transistor in an open-loop manner to provide references for the "high" voltage level $V_{GHIGH}$ and the "low" voltage level $V_{GLOW}$ that drive the driver transistors of the differential pair.

In the embodiments described earlier in connection with FIGS. 7, 9, 10, and 11, the transistors of the differential pair are kept in the saturation region when "on" by controlling either the value of the high voltage level $V_{GHIGH}$ or, conjointly, the values of the high and low voltage levels ($V_{GHIGH}$ and $V_{GLOW}$) of the pre-driver stages 710, 906, 1002, 1110. If a similar design (open drain configuration) as the output stage (driver stage) is used for the pre-driver stage or circuit, the low voltage level ($V_{GLOW}$) used to fully turn "off" the un-driven half of the differential pair can advantageously be controlled. When a pre-driver stage is implemented with an open-drain differential pair, generating this low voltage level ($V_{GLOW}$) as an output corresponds to using a relatively high input voltage on the pre-driver circuit's input. This can result in the pre-driver stage being overdriven out of saturation and into the triode or linear region. Accordingly, it is desirable to generate a relatively high, such as the highest possible or maximal, low voltage level for the pre-driver.

The minimal high voltage level $V_{GHIGH(MIN)}$ to be applied on the gate of the differential pair can be expressed as in the Equation 11, assuming transistor M1 is "on."

$$V_{GHIGH(MIN)} = V_{S(M1,M2)} + V_{GST(M1)} + V_T \qquad \text{Equation 11}$$

The maximal low voltage $V_{GLOW(MAX)}$ to turn off the other transistor in the differential pair can be determined by setting $V_{GST(M2)}$ to zero (assuming no sub-threshold conduction) as expressed in Equation 12.

$$V_{GLOW(MAX)} = V_{S(M1,M2)} + 0 + V_T \qquad \text{Equation 12}$$

Thus, the minimum single-ended output swing of the pre-driver circuit 1306 corresponds to the difference between $V_{GHIGH(MIN)}$ and $V_{GLOW(MAX)}$ and is expressed in Equation 13.

$$V_{GHIGH(MIN)} - V_{GLOW(MAX)} = V_{GST(M1,M2)} \qquad \text{Equation 13}$$

To generate a relatively low, such as the minimum, single-ended output swing $V_{GST(M1,M2)}$, a circuit can be added to the circuit described earlier in connection with FIG. 11A as shown in FIG. 13.

This illustrated circuit generates a second voltage $V_{GX}$ 1302 using a replica transistor $MR1_{MIN}$ 1304. The replica transistor $MR1_{MIN}$ 1304 is scaled such that its equivalent width/length ratio is at least 4 times larger than that of replica transistor MR1 1102.

The voltages $V_{GH}$ 1112 and $V_{GX}$ 1302 are expressed by Equations 14A and 14B, respectively.

$$V_{GH} = I_{REF} * R_{REF} + V_{GST(MR1)} + V_T \qquad \text{Equation 14A}$$

$$V_{GX} = I_{REF} * R_{REF} + V_{GST(MR1)}/2 + V_T \qquad \text{Equation 14B}$$

The difference between voltage $V_{GH}$ 1112 and voltage $V_{GX}$ 1302 is expressed by Equation 15.

$$V_{GH} - V_{GX} = V_{GST(MR1)}/2 \qquad \text{Equation 15}$$

Because replica transistor MR1 1102 is a replica of transistor M1 704, $V_{GST(MR1)} \approx V_{GST(M1)}$. Using Equation 13 and Equation 15, the relationship expressed in Equation 16 holds (using labels of FIGS. 14).

$$V_{GL}=V_{GH}-(V_{GH}-V_{GX})*2 \qquad \text{Equation 16}$$

As some extra margin is typically used to completely turn off the selected transistor of the differential pair, the difference between $V_{GHIGH}$ and $V_{GLOW}$ that is used is typically increased from the calculated difference expressed in Equation 16, such as, for example, by generating a smaller voltage $V_{GX}$ 1302 or by using a constant larger than 2 in Equation 16. An example of circuit that can generate a reference for the minimum low voltage level $V_{GLOW(MAX)}$ from voltage $V_{GH}$ 1112 and voltage $V_{GX}$ 1302 will be described later in connection with FIG. 14. For example, the circuit for generating the reference for the minimum low voltage level $V_{GLOW(MAX)}$ can be used in the pre-driver circuit or stage 1306. In one embodiment, the value for voltage $V_{GLOW(MAX)}$ used is equal to voltage $V_{GL}$.

A voltage of value $V_{GLOW(MAX)}$ can then be used to generate the appropriately small swings for the pre-driver circuit 1306. In addition to reducing the amplitude typically used to drive the pre-driver circuit 1306, this also reduces the pre-driver feed-through, reduces power consumption and simplifies the design of the pre-driver circuit 1306. As described earlier in connection with the pre-driver circuit 1110 of FIG. 11A, the high voltage output level $V_{GHIGH}$ of the differential output of the pre-driver circuit 1306 is determined from the voltage reference $V_{GH}$ 1112.

In the circuit illustrated in FIG. 13, a voltage drop $V_D$ 1308 is optional and serves a similar purpose as that of resistor $R_D$ 1108, that is, the voltage drop $V_D$ 1308 adjusts the drain voltage of the replica transistor $MR1_{MIN}$ 1304 such that it matches better operating conditions in the differential pairs. This reduces second-order effects. The voltage drop VD 1308 can be implemented in a variety of ways, such as for example, by dropping voltage across a resistor. In the illustrated embodiment, a second current source $I_{REF}$ 1310 and a second resistor $R_{REF}$ 1312 are matched to the current source $I_{REF}$ 1106 and the resistor $R_{REF}$ 1104 described earlier in connection with FIG. 11A.

In the circuit illustrated in FIG. 13, a relatively high value, such as the maximum value, for the low voltage level $V_{GLOW}$ that can still completely turn off the inactive or cutoff transistor of the differential pair is generated. This is achieved in the illustrated embodiment by generating an appropriate value for the output swing $V_{GST}$ of the pre-driver circuit 1306 through a difference in voltage from two replica circuits. It will be appreciated by one of ordinary skill in the art that the embodiment illustrated in FIG. 13 can be varied in a very broad number of ways. For example, in one alternative embodiment, different reference current levels for each replica transistor MR1 1102 and $MR1_{MIN}$ 1304 are used, and the effective width of replica transistors M1R 1102 and $M1R_{MIN}$ 1304 is kept same. It should be noted that any combination of equivalent currents or transistor widths can also be used. In addition, using current or transistor ratios larger than four can be used to take into account second-order effects, such as sub-threshold conduction. Furthermore, other methods than the one described here can be used to generate source voltages of replica transistors MR1 1102 and $MR1_{MIN}$ 1304 to keep transistor M3 726 saturated. In addition, it should be noted that a connection 1314 illustrated in FIG. 13 between the source terminals of replica transistors MR1 1102 and $MR1_{MIN}$ 1304 is optional and can be removed; however, the connection 1314 improves matching by averaging out defects.

The generation of a relatively good reference for the low voltage level $V_{GLOW}$ can be combined with the topologies described earlier in connection with FIGS. 7, 9, 10, and 11. However, it should be noted that the topology illustrated in FIG. 11A also advantageously permits re-use of circuitry.

It should also be noted that the transistor $M3_{REF}$ 802 and resistor $R_{DELTA}$ 1114 described earlier in connection with FIG. 11B can be used to replace resistor $R_{REF}$ 1104 or resistor $R_{REF}$ 1312 of FIG. 13. Of course, where connected by the connection 1314, the equivalent resistances should be used. By scaling transistor $M3_{REF}$ 802 as described earlier in connection with FIGS. 8 and/or 11B, the saturation of transistor M3 726 can also be achieved by this circuit, and process, voltage and temperature (PVT) variations can advantageously be tracked.

FIG. 14 illustrates an example of a biasing circuit that is configured to generate a reference voltage $V_{GL}$ 1418 for the low voltage level $V_{GLOW}$ from the reference $V_{GH}$ 1112 for the high voltage level $V_{GHIGH}$ and the second voltage $V_{GX}$ 1302. In one example, the biasing circuit is incorporated into a pre-driver circuit, such as the pre-driver circuit 1306 illustrated in FIG. 13.

The illustrated circuit of FIG. 14 includes a first operational amplifier 1402, a second operational amplifier 1404, and a third operational amplifier 1406. These operational amplifiers 1402, 1404, 1406 are configured as voltage followers. The first operation amplifier 1402 is coupled to a PMOS transistor 1408. The voltage follower configuration for the first operational amplifier 1402 provides that the source terminal of the PMOS transistor 1408 is maintained at the voltage $V_{GX}$ 1302.

The second operational amplifier 1404 is coupled to an NMOS transistor 1410. The voltage follower configuration for the second operational amplifier 1404 provides that the source terminal of the NMOS transistor 1410 is maintained at the voltage $V_{GH}$ 1112. With a known voltage $V_{GH}$ 1112 at a first terminal of a resistor $R_X/2$ 1412 and a known voltage $V_{GX}$ 1302 at a second terminal of the resistor $R_X/2$ 1412, a reference current $I_{REF}$ 1414 flowing through the resistor $R_X/2$ 1412, the NMOS transistor 1410, and the PMOS transistor 1408 can be determined. This reference current $I_{REF}$ 1414 is then mirrored through transistors $M_{M1}$ 1420 and $M_{M2}$ 1422 such that a current of the same magnitude, $I_{REF}$ 1424 also flows through a second resistor $R_X$ 1416. Also, it should be noted that in the illustrated embodiment, transistors $M_A$ 1426 and $M_B$ 1428 form a source-coupled pair to steer the reference current $I_{REF}$ 1414 through to the mirror transistor $M_{M2}$ 1422. However, it should also be noted that the circuit can be configured such that the transistor $M_A$ 1426 is always activated or "on," so that transistor $M_B$ 1428 is optional.

In the illustrated circuit, the second resistor $R_X$ 1416 has twice the resistance of the resistor $R_X/2$ 1412. The voltage follower configuration of the third operational amplifier 1406 provides that the output of the third operational amplifier 1406 and a first terminal of the second resistor $R_X$ 1416 is maintained at the voltage $V_{GH}$ 1112. Accordingly, the reference voltage $V_{GL}$ 1418 corresponds to the voltage at the first terminal of the second resistor $R_X$ 1416 ($V_{GH}$ 1112) less the I*R voltage drop across the second resistor $R_X$ 1416. In one embodiment, the value of the reference voltage $V_{GL}$ 1418 corresponds to the reference voltage for $V_{GLOW(MIN)}$ and is used as a reference for the low voltage level $V_{GLOW}$. The voltage $V_{GL}$ is expressed by Equation 16. In this specific embodiment, node $V_{GL}$ 1418 can be connected directly to $V_{G(M2)}$ to complete the pre-driver circuit.

Various embodiments have been described above. Although described with reference to these specific embodiments, the descriptions are intended to be illustrative of the invention and are not intended to be limiting. Various modifications and applications may occur to those skilled in the art without departing from the true spirit and scope of the invention as defined in the appended claims.

The invention claimed is:

1. A method of biasing a differential driver with a first transistor and a second transistor, the method comprising:
providing a differential drive signal to a gate of the first transistor and to a gate of the second transistor, wherein each portion of the differential drive signal is switched between a first voltage level and a second voltage level higher than the first voltage level in a complementary manner such that the transistor receiving the first voltage level is deactivated and the transistor receiving the second voltage level is activated; and
electronically adjusting at least the second voltage level such that the activated transistor is operating in the saturation region, wherein the second voltage level is adjusted by regulating a voltage at a source terminal of the first transistor and the second transistor.

2. The method as defined in claim 1, wherein the voltage at the source terminal is regulated to a reference voltage having a predetermined value.

3. The method as defined in claim 1, wherein the voltage at the source terminal is regulated to a reference voltage that varies at least partially in response to changing saturation voltage $V_{DSAT}$.

4. The method as defined in claim 1, further comprising low-pass filtering the voltage at a source terminal when sensing for voltage for regulation.

5. The method as defined in claim 1, wherein electronically adjusting the second voltage level further comprises using a feedback loop to regulate a voltage at a source terminal of the first transistor and the second transistor, wherein the second voltage level is in the feedback loop.

6. The method as defined in claim 1, wherein electronically adjusting at least the second voltage level comprises compensating for process, voltage, and temperature (PVT) variations.

7. The method as defined in claim 1, further comprising biasing a third transistor in the saturation region, wherein the third transistor is coupled to the sources of the first transistor and the second transistor, wherein the third transistor is used as a current sink or current source.

8. A method of biasing a differential driver with a first transistor and a second transistor, the method comprising:
providing a differential drive signal to a gate of the first transistor and to a gate of the second transistor, wherein each portion of the differential drive signal is switched between a first voltage level and a second voltage level higher than the first voltage level in a complementary manner such that the transistor receiving the first voltage level is deactivated and the transistor receiving the second voltage level is activated;
electronically adjusting at least the second voltage level such that the activated transistor is operating in the saturation region;
regulating a source voltage of an activated replica transistor such that the activated replica transistor is operating in the saturation region; and
using an adjustment signal for the activated replica transistor as a reference voltage for the second voltage level of the differential drive.

9. The method as defined in claim 8, wherein the activated replica transistor is half of a replica differential pair.

10. The method as defined in claim 8, wherein electronically adjusting at least the second voltage level comprises compensating for process, voltage, and temperature (PVT) variations.

11. The method as defined in claim 8, further comprising biasing a third transistor in the saturation region, wherein the third transistor is coupled to the sources of the first transistor and the second transistor, wherein the third transistor is used as a current sink or current source.

* * * * *